US012327766B2

(12) United States Patent
Sakamoto et al.

(10) Patent No.: US 12,327,766 B2
(45) Date of Patent: *Jun. 10, 2025

(54) LASER PROCESSING METHOD, SEMICONDUCTOR DEVICE MANUFACTURING METHOD, AND EXAMINATION DEVICE

(71) Applicant: HAMAMATSU PHOTONICS K.K., Hamamatsu (JP)

(72) Inventors: Takeshi Sakamoto, Hamamatsu (JP); Yasutaka Suzuki, Hamamatsu (JP); Iku Sano, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 645 days.

This patent is subject to a terminal disclaimer.

(21) Appl. No.: 17/281,505

(22) PCT Filed: Oct. 2, 2019

(86) PCT No.: PCT/JP2019/039002
§ 371 (c)(1),
(2) Date: Mar. 30, 2021

(87) PCT Pub. No.: WO2020/071455
PCT Pub. Date: Apr. 9, 2020

(65) Prior Publication Data
US 2021/0398855 A1    Dec. 23, 2021

(30) Foreign Application Priority Data
Oct. 4, 2018  (JP) .................................. 2018-189309

(51) Int. Cl.
*H01L 21/78*    (2006.01)
*B23K 26/00*    (2014.01)
(Continued)

(52) U.S. Cl.
CPC .......... *H01L 21/78* (2013.01); *B23K 26/0006* (2013.01); *B23K 26/0093* (2013.01);
(Continued)

(58) Field of Classification Search
CPC ..... H01L 21/78; H01L 22/12; B23K 26/0006; B23K 26/0093; B23K 26/032;
(Continued)

(56) References Cited

U.S. PATENT DOCUMENTS 6,407,360 B1 *  6/2002  Choo ..................... B28D 5/00
                                                    219/121.68
8,946,055 B2 *  2/2015  Sakamoto ............. B23K 26/40
                                                    438/464
(Continued)

FOREIGN PATENT DOCUMENTS

CN      106163724 A      11/2016
JP      2006-147818 A    6/2006
(Continued)

OTHER PUBLICATIONS

International Preliminary Report on Patentability mailed Apr. 15, 2021 for PCT/JP2019/039002.

*Primary Examiner* — Su C Kim
(74) *Attorney, Agent, or Firm* — Faegre Drinker Biddle & Reath LLP

(57) ABSTRACT

An inspecting device includes a stage configured to support a wafer in which a plurality of rows of modified regions are formed in a semiconductor substrate, a light source configured to output, an objective lens configured to pass light propagated through the semiconductor substrate, a light detection part configured to detect light passing through the objective lens, and an inspection part configured to inspect a tip position of a fracture in an inspection region between a back surface and the modified region closest to the back (Continued)

surface of the semiconductor substrate. The objective lens aligns a focus from the back surface side in an inspection region. The light detection part detects light propagating from the front surface side of the semiconductor substrate to the back surface side.

9 Claims, 18 Drawing Sheets

(51) Int. Cl.
- *B23K 26/03* (2006.01)
- *B23K 26/53* (2014.01)
- *H01L 21/66* (2006.01)
- *B23K 103/00* (2006.01)
- *B24B 7/22* (2006.01)
- *B24B 49/12* (2006.01)

(52) U.S. Cl.
CPC ............ *B23K 26/032* (2013.01); *B23K 26/53* (2015.10); *H01L 22/12* (2013.01); *B23K 2103/56* (2018.08); *B24B 7/228* (2013.01); *B24B 49/12* (2013.01)

(58) Field of Classification Search
CPC .. B23K 26/53; B23K 2103/56; B23K 26/364; B23K 2101/40; B24B 7/228; B24B 49/12
See application file for complete search history.

(56) References Cited

U.S. PATENT DOCUMENTS

| | | | | |
|---|---|---|---|---|
| 9,035,216 | B2* | 5/2015 | Sugiura | B23K 26/40 |
| | | | | 219/121.67 |
| 9,076,855 | B2* | 7/2015 | Sugiura | B23K 26/40 |
| 11,450,576 | B2* | 9/2022 | Sakamoto | H01L 21/268 |
| 2008/0035611 | A1* | 2/2008 | Kuno | C03B 33/0222 |
| | | | | 219/69.1 |
| 2015/0192529 | A1* | 7/2015 | Sato | G01N 21/4738 |
| | | | | 356/73 |
| 2015/0343562 | A1* | 12/2015 | Hirose | B23K 26/0648 |
| | | | | 425/135 |
| 2017/0355635 | A1* | 12/2017 | Li | B23K 26/402 |

FOREIGN PATENT DOCUMENTS

| | | | |
|---|---|---|---|
| JP | 2007-132761 A | 5/2007 | |
| JP | 2008-147818 A | 6/2008 | |
| JP | 2010-247214 A | 11/2010 | |
| JP | 2012-109358 A | 6/2012 | |
| JP | 2013-258253 A | 12/2013 | |
| JP | 2017-017290 A | 1/2017 | |
| JP | 2017-064746 A | 4/2017 | |
| JP | 2017-133997 A | 8/2017 | |
| JP | 2018-098296 A | 6/2018 | |
| KR | 10-2010-0076918 A | 7/2010 | |
| KR | 10-2011-0124207 A | 11/2011 | |

* cited by examiner

LASER PROCESSING METHOD, SEMICONDUCTOR DEVICE MANUFACTURING METHOD, AND EXAMINATION DEVICE

TECHNICAL FIELD

The present disclosure relates to a laser processing method, a method for manufacturing a semiconductor device, and an inspecting device.

BACKGROUND ART

A laser processing device that, in order to cut a wafer including a semiconductor substrate and a functional element layer formed on the front surface of the semiconductor substrate, along each of a plurality of lines, forms a plurality of rows of modified regions in the semiconductor substrate along each of the plurality of lines by irradiating the wafer with laser light from the back surface side of the semiconductor substrate is known. The laser processing device disclosed in Patent Literature 1 includes an infrared camera, and thus is capable of observing the modified region formed in the semiconductor substrate, a processing damage formed in the functional element layer, and the like from the back surface side of the semiconductor substrate.

CITATION LIST

Patent Literature

Patent Literature 1: Japanese Unexamined Patent Publication No. 2017-64746

SUMMARY OF INVENTION

Technical Problem

In the laser processing device as described above, the wafer may be irradiated with laser light from the back surface side of the semiconductor substrate under a condition that fracture extending through the plurality of rows of modified regions is formed. In such a case, if the fracture extending through the plurality of rows of modified regions is not sufficiently extended to the front surface side of the semiconductor substrate due to, for example, a problem of the laser processing device, it may not be possible to reliably cut the wafer along each of the plurality of lines in the subsequent steps. In particular, in a case where the back surface of the semiconductor substrate is ground after the modified regions are formed, if it is not possible to check whether or not the fracture extending through the plurality of rows of modified regions is sufficiently extended to the front surface side of the semiconductor substrate, it is not possible to reliably cut the wafer along each of the plurality of lines after the grinding step, and the grinding step may be useless.

It is difficult to check whether or not the fracture extending through the plurality of rows of modified regions is sufficiently extended to the front surface side of the semiconductor substrate only by observing the modified regions. Observation of the fracture extending through the plurality of rows of modified regions is also considered, but it is difficult to observe the fracture simply by using an infrared camera because the width of the fracture is usually smaller than the wavelength of infrared rays.

An object of the present disclosure is to provide a laser processing method, a method for manufacturing a semiconductor device, and an inspecting device capable of checking whether or not fracture extending through a plurality of rows of modified regions is sufficiently extended to a front surface side of a semiconductor substrate.

Solution to Problem

According to an aspect of the present disclosure, a laser processing method includes a first step of preparing a wafer including a semiconductor substrate having a front surface and a back surface and a functional element layer formed on the front surface, and forming a plurality of rows of modified regions in the semiconductor substrate along each of a plurality of lines by irradiating the wafer with laser light from the back surface side along each of the plurality of lines, and a second step of inspecting a tip position of a fracture in an inspection region between the back surface and the modified region closest to the back surface among the plurality of rows of modified regions, the fracture extending to the back surface side from the modified region closest to the back surface. In the first step, the wafer is irradiated with the laser light from the back surface side along each of the plurality of lines under a condition that a fracture extending through the plurality of rows of modified regions is formed. In the second step, the tip position is inspected by aligning a focus from the back surface side in the inspection region and detecting light propagating in the semiconductor substrate from the front surface side to the back surface side.

In the laser processing method, the focus is aligned from the back surface side of the semiconductor substrate in the inspection region between the back surface and the modified region closest to the back surface of the semiconductor substrate, and the light propagating in the semiconductor substrate from the front surface side to the back surface side is detected. Since the light is detected in this manner, it is possible to check the tip position of the fracture extending to the back surface side of the semiconductor substrate from the modified region closest to the back surface, in the inspection region. In a case where the tip position of the fracture is located on the front surface side of the semiconductor substrate with respect to a reference position between the back surface and the modified region closest to the back surface of the semiconductor substrate, it is assumed that the fracture extending through a plurality of rows of modified regions is not sufficiently extended to the front surface side of the semiconductor substrate. Thus, according to the laser processing method, it is possible to check whether or not the fracture extending through the plurality of rows of modified regions is sufficiently extend to the front surface side of the semiconductor substrate.

In the laser processing method in the aspect of the present disclosure, in the first step, the wafer may be irradiated with the laser light from the back surface side along each of the plurality of lines under a condition that the fracture extending through the plurality of rows of modified regions reaches the front surface. According to this, it is possible to check whether or not the fracture extending through the plurality of rows of modified regions reaches the front surface of the semiconductor substrate.

According to the aspect of the present disclosure, the laser processing method may further include a third step of evaluating a processing result in the first step based on an inspection result in the second step. In the third step, it may be evaluated that the fracture extending through the plurality of rows of modified regions reaches the front surface, in a case where the tip position is located on the back surface side with respect to a reference position between the back surface and the modified region closest to the back surface, and it may be evaluated that the fracture extending through the plurality of rows of modified regions does not reach the front surface, in a case where the tip position is located on the front surface side with respect to the reference position. According to this, it is possible to determine an embodiment of the subsequent steps based on the evaluation result.

In the laser processing method in the aspect of the present disclosure, the inspection region may be a region extending from the reference position to the back surface side and not reaching the back surface side. In the third step, it may be evaluated that the fracture extending through the plurality of rows of modified regions reaches the front surface, in a case where the tip position is located in the inspection region, and it may be evaluated that fracture extending through the plurality of rows of modified regions does not reach the front surface, in a case where the tip position is not located in the inspection region. The tip position of the fracture is more stable in a case where the fracture extending through the plurality of rows of modified regions does not reach the front surface of the semiconductor substrate than a case where when the fracture extending through the plurality of rows of modified regions reaches the front surface of the semiconductor substrate. Thus, it is possible to efficiently inspect the fracture extending through the plurality of rows of modified regions by setting a region that extends from a reference position to the back surface side of the semiconductor substrate and does not reach the back surface, as the inspection region.

In the laser processing method in the one aspect of the present disclosure, the plurality of rows of modified regions may be two rows of modified regions. According to this, it is possible to efficiently perform the formation of a plurality of rows of modified regions and the inspection of the fracture extending through the plurality of rows of modified regions.

According to another aspect of the present disclosure, a method for manufacturing a semiconductor device includes the first step, the second step, and the third step in the above-described laser processing method, and a fourth step, in a case where it is evaluated that the fracture extending through the plurality of rows of modified regions reaches the front surface in the third step, exposing the fracture extending through the plurality of rows of modified regions to the back surface by grinding the back surface, and cutting the wafer into a plurality of semiconductor devices along each of the plurality of lines.

According to the method for manufacturing a semiconductor device, in a case where it is evaluated that the fracture extending through the plurality of rows of modified regions does not reach the front surface of the semiconductor substrate, the back surface of the semiconductor substrate is not ground. Thus, it is possible to prevent an occurrence of a situation in which it is not possible to reliably cut a wafer along each of a plurality of lines after the grinding step.

In the method for manufacturing a semiconductor device in the aspect of the present disclosure, in the fourth step, the back surface may be ground up to at least to a reference position in the fourth step. According to this, it is possible to reliably cut the wafer along each of the plurality of lines.

According to still another aspect of the present disclosure, an inspecting device includes a stage configured to support a wafer including a semiconductor substrate having a front surface and a back surface and a functional element layer formed on the front surface, the wafer in which a plurality of rows of modified regions are formed in the semiconductor substrate along each of a plurality of lines, a light source configured to output light having transparency to the semiconductor substrate, an objective lens configured to pass the light output from the light source and propagated through the semiconductor substrate, a light detection part configured to detect the light passing through the objective lens, and an inspection part configured to inspect a tip position of a fracture in an inspection region between the back surface and the modified region closest to the back surface among the plurality of rows of modified regions, based on a signal output from the light detection part, the fracture extending to the back surface side from the modified region closest to the back surface. The objective lens aligns a focus from the back surface side in the inspection region, and the light detection part detects the light propagating in the semiconductor substrate from the front surface side to the back surface side.

The inspecting device aligns the focus from the back surface side of the semiconductor substrate in the inspection region between the back surface and the modified region closest to the back surface of the semiconductor substrate, and detects the light propagating in the semiconductor substrate from the front surface side to the back surface side. Since the light is detected in this manner, it is possible to check the tip position of the fracture extending to the back surface side of the semiconductor substrate from the modified region closest to the back surface, in the inspection region.

In the inspecting device in the aspect of the present disclosure, the numerical aperture of the objective lens may be 0.45 or more. According to this, it is possible to more reliably check the tip position of the fracture in the inspection region.

In the inspecting device in the one aspect of the present disclosure, the objective lens may have a correction ring. According to this, it is possible to more reliably check the tip position of the fracture in the inspection region.

Advantageous Effects of Invention

According to the present disclosure, it is possible to provide a laser processing method, a method for manufacturing a semiconductor device, and an inspecting device capable of checking whether or not fracture extending through a plurality of rows of modified regions is sufficiently extended to a front surface side of a semiconductor substrate.

DESCRIPTION OF EMBODIMENTS

Hereinafter, embodiments of the present disclosure will be described in detail with reference to the drawings. The same or corresponding parts in the respective drawings are denoted with the same reference signs, and repetitive descriptions will be omitted.

[Configuration of Laser Processing Device]

Figure 1:
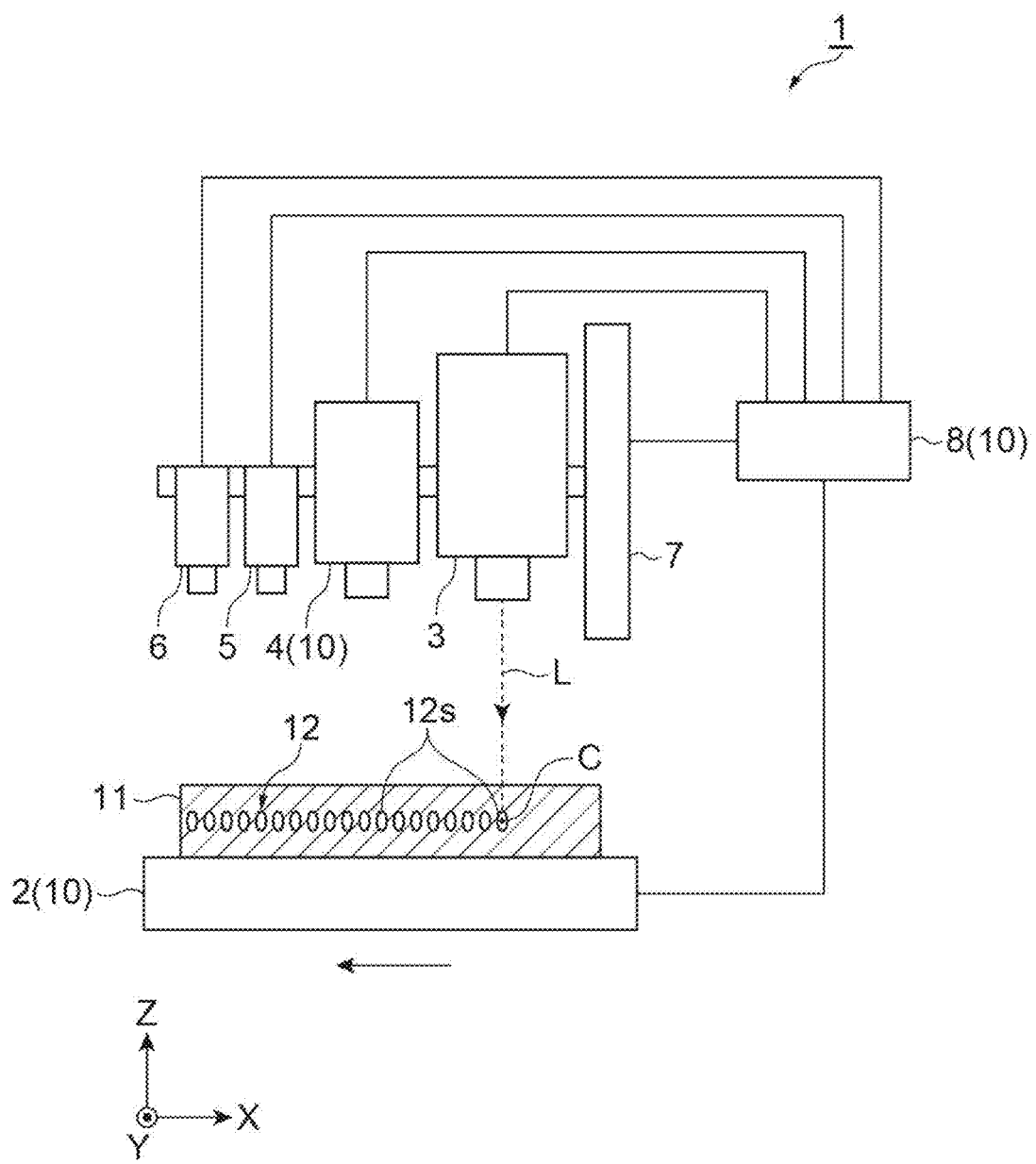
FIG. 1 is a configuration diagram illustrating a laser processing device including an inspecting device according to an embodiment.

As illustrated in FIG. 1, a laser processing device 1 includes a stage 2, a laser irradiation unit 3, a plurality of image capturing units 4, 5 and 6, a drive unit 7, and a control unit 8. The laser processing device 1 is a device that forms a modified region 12 on an object 11 by irradiating the object 11 with laser light L.

The stage 2 supports the object 11 by, for example, adsorbing a film attached to the object 11. The stage 2 can move along an X-direction and a Y-direction, respectively, and can rotate around an axis parallel to a Z-direction as a center line. The X-direction and the Y-direction are referred to as a first horizontal direction and a second horizontal direction that are perpendicular to each other, and the Z-direction is the vertical direction.

The laser irradiation unit 3 collects the laser light L having transparency to the object 11 and the object 11 with the laser light. If the laser light L is focused in the object 11 supported by the stage 2, the laser light L is particularly absorbed at a portion corresponding to a focusing point C of the laser light L, and thus the modified region 12 is formed in the object 11.

The modified region 12 is a region in which the density, the refractive index, the mechanical strength, and other physical properties are different from those of the surrounding non-modified region. Examples of the modified region 12 include a melting treatment region, a crack region, a dielectric breakdown region, and a refractive index change region. The modified region 12 has a characteristic that fractures easily extend from the modified region 12 to the incident side of the laser light L and the opposite side. Such characteristics of the modified region 12 are used for cutting the object 11.

As an example, if the stage 2 is moved along the X-direction and the focusing point C is moved relative to the object 11 along the X-direction, a plurality of modified spots 12s are formed to be arranged in one row along the X-direction. One modified spot 12s is formed by irradiation with the laser light L of one pulse. The modified region 12 in one row is a set of a plurality of modified spots 12s arranged in one row. Adjacent modified spots 12s may be connected to each other or separated from each other, depending on the relative movement speed of the focusing point C with respect to the object 11 and the repetition frequency of the laser light L.

The image capturing unit 4 captures images of the modified region 12 formed on the object 11 and the tip of the fracture extending from the modified region 12. In the present embodiment, the control unit 8 functions as an inspection part, and the stage 2, the image capturing unit 4, and the control unit 8 function as an inspecting device 10 (details will be described later).

Under the control of the control unit 8, the image capturing units 5 and 6 capture an image of the object 11 supported by the stage 2 with light transmitted through the object 11. The images obtained by the image capturing units 5 and 6 performing image capturing are, for example, used for alignment of the irradiation position of the laser light L.

The drive unit 7 supports the laser irradiation unit 3 and a plurality of image capturing units 4, 5, and 6. The drive unit 7 moves the laser irradiation unit 3 and the plurality of image capturing units 4, 5, 6 along the Z-direction.

The control unit 8 controls the operations of the stage 2, the laser irradiation unit 3, the plurality of image capturing units 4, 5, 6, and the drive unit 7. The control unit 8 is configured as a computer device including a processor, a memory, a storage, a communication device, and the like. In the control unit 8, the processor executes software (program) read into the memory or the like, and controls reading and writing of data in the memory and the storage, and communication by a communication device. Thus, the control unit 8 realizes, for example, a function as an inspection part (details will be described later).

[Configuration of Object]

Figure 2:
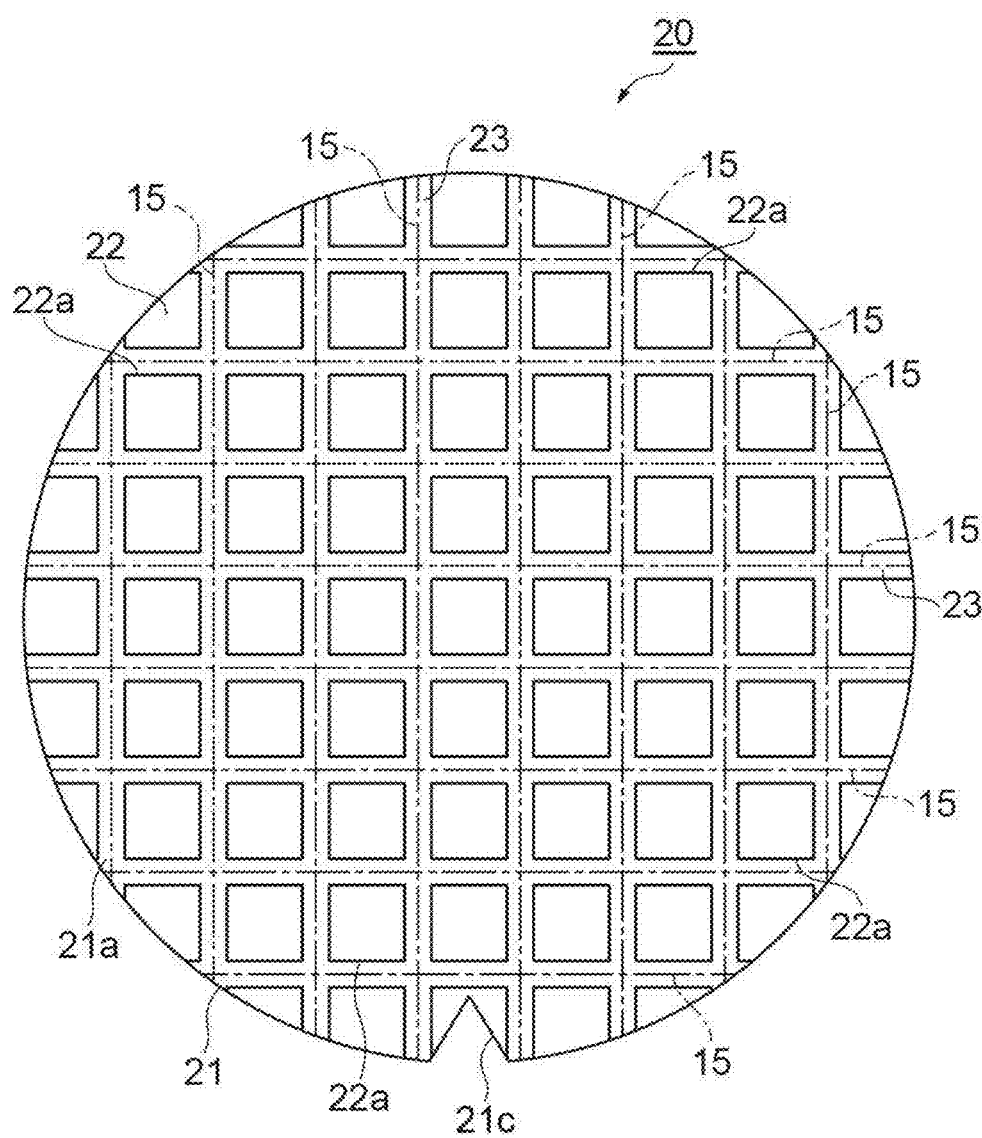
FIG. 2 is a plan view illustrating a wafer in the embodiment.
Figure 3:
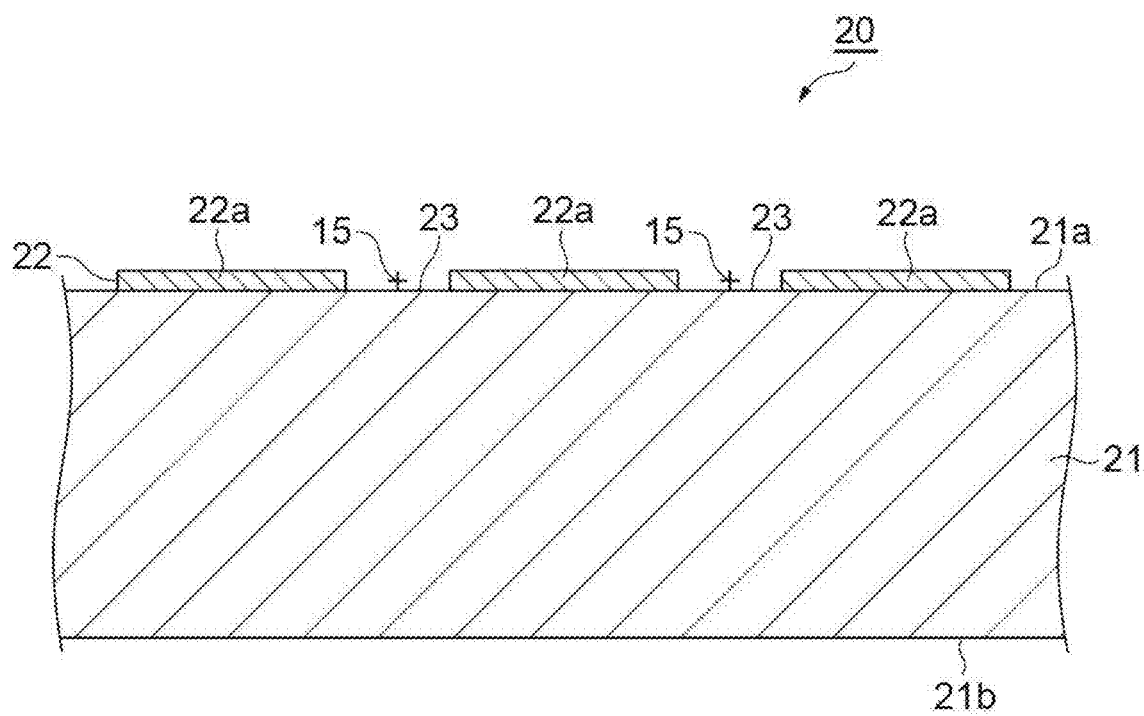
FIG. 3 is a cross-sectional view illustrating a portion of the wafer illustrated in FIG. 2.

The object 11 in the present embodiment is a wafer 20 as illustrated in FIGS. 2 and 3. The wafer 20 includes a semiconductor substrate 21 and a functional element layer 22. The semiconductor substrate 21 has a front surface 21a and a back surface 21b. The semiconductor substrate 21 is, for example, a silicon substrate. The functional element layer 22 is formed on the front surface 21a of the semiconductor substrate 21. The functional element layer 22 includes a plurality of functional elements 22a arranged two-dimensionally along the front surface 21a. The functional element 22a is, for example, a light receiving element such as a photodiode, a light emitting element such as a laser diode, a circuit element such as a memory, or the like. The functional element 22a may be configured three-dimensionally by stacking a plurality of layers. Although the semiconductor substrate 21 is provided with a notch 21c indicating the crystal orientation, an orientation flat may be provided instead of the notch 21c.

The wafer 20 is cut into functional elements 22a along each of the plurality of lines 15. The plurality of lines 15 pass between a plurality of functional elements 22a in a case of being viewed from the thickness direction of the wafer 20. More specifically, the line 15 passes through the center (center in the width direction) of a street region 23 in a case of being viewed from the thickness direction of the wafer 20. The street region 23 extends to pass between adjacent functional elements 22a in the functional element layer 22. In the present embodiment, the plurality of functional elements 22a are arranged in a matrix along the front surface 21a, and the plurality of lines 15 are set in a grid. Although the line 15 is a virtual line, the line may be a line actually drawn.

[Configuration of Laser Irradiation Unit]

Figure 4:
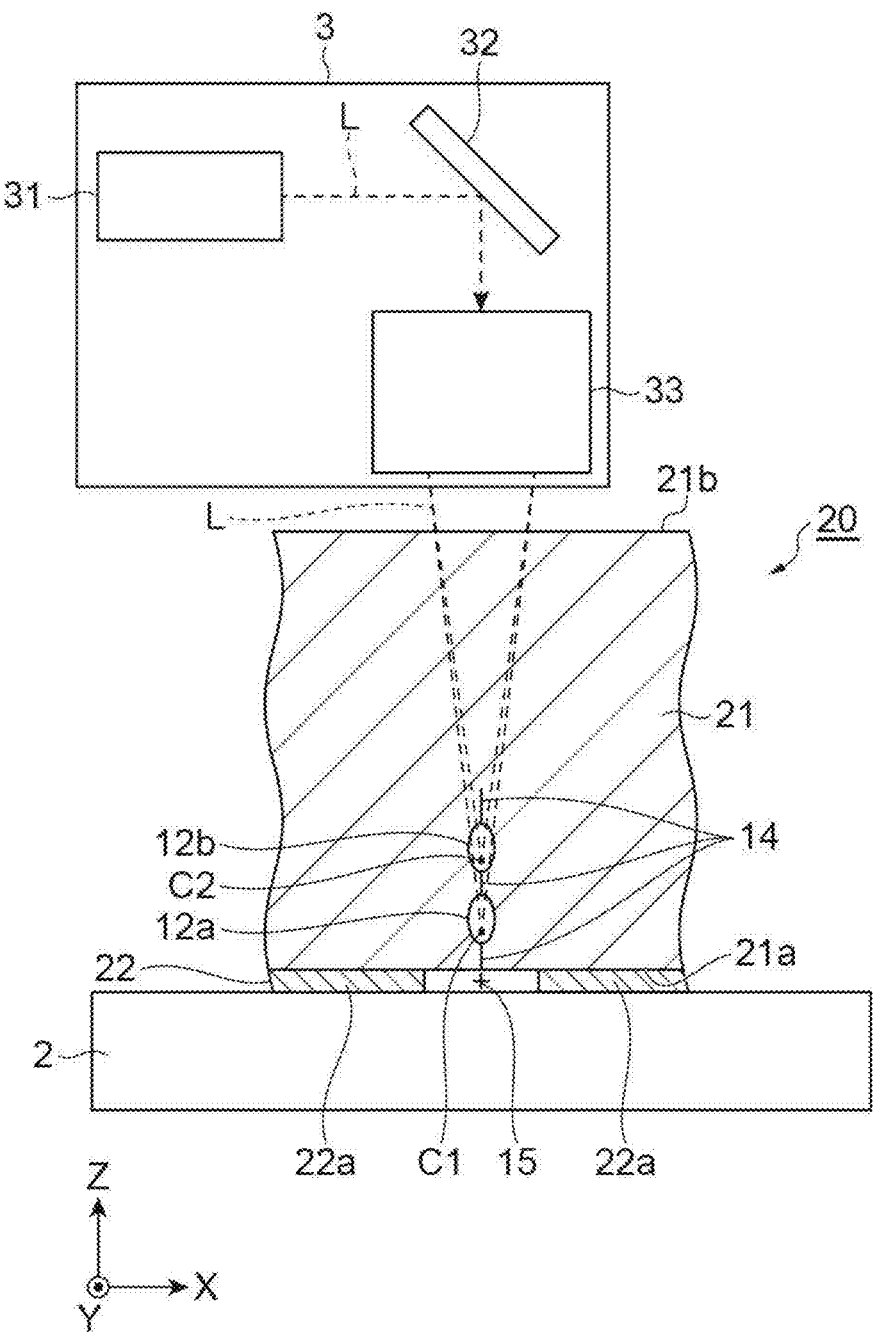
FIG. 4 is a configuration diagram illustrating a laser irradiation unit illustrated in FIG. 1.

As illustrated in FIG. 4, the laser irradiation unit 3 includes a light source 31, a spatial light modulator 32, and a condenser lens 33.

The light source 31 outputs the laser light L by, for example, a pulse oscillation method. The spatial light modulator 32 modulates the laser light L output from the light source 31. The spatial light modulator 32 is, for example, a spatial light modulator (SLM) of a reflective liquid crystal (LCOS: Liquid Crystal on Silicon). The condenser lens 33 collects the laser light L modulated by the spatial light modulator 32.

In the present embodiment, the laser irradiation unit 3 irradiates the wafer 20 with the laser light L from the back surface 21b side of the semiconductor substrate 21 along each of the plurality of lines 15, so as to form two rows of modified regions 12a and 12b in the semiconductor substrate 21 along each of the plurality of lines 15. The modified region (first modified region) 12a is the modified region closest to the front surface 21a of the two rows of modified regions 12a and 12b. The modified region (second modified region) 12b is the modified region closest to the modified region 12a among two rows of the modified regions 12a and 12b, and is the modified region closest to the back surface 21b.

The two rows of modified region 12a and 12b are adjacent to each other in the thickness direction (Z-direction) of the wafer 20. The two rows of modified regions 12a and 12b are formed by moving two focusing points C1 and C2 relative to the semiconductor substrate 21 along the line 15. The laser light L is modulated by the spatial light modulator 32 so that, for example, the focusing point C2 is located on the rear side in a traveling direction and on the incident side of the laser light L with respect to the focusing point C1.

The laser irradiation unit 3 irradiates the wafer 20 with the laser light L from the back surface 21b side of the semiconductor substrate 21 along each of the plurality of lines 15 under a condition that fracture 14 extending through the two rows of modified regions 12a and 12b reaches the front surface 21a of the semiconductor substrate 21. As an example, for the semiconductor substrate 21 which is a single crystal silicon substrate having a thickness of 775 μm, the two focusing points C1 and C2 are aligned at positions of 54 μm and 128 μm from the front surface 21a. Then, the wafer 20 is irradiated with the laser light L from the back surface 21b side of the semiconductor substrate 21 along each of the plurality of lines 15. At this time, the wavelength of the laser light L is 1099 nm, the pulse width is 700 nsec, and the repetition frequency is 120 kHz. In addition, the output of the laser light L at the focusing point C1 is 2.7 W, the output of the laser light L at the focusing point C2 is 2.7 W, and the relative movement speeds of the two focusing points C1 and C2 with respect to the semiconductor substrate 21 are 800 mm/sec.

The formation of such two rows of modified regions 12a, 12b and fracture 14 is performed in the following cases. That is, in a case where, in the subsequent steps, the back surface 21b of the semiconductor substrate 21 is ground to thin the semiconductor substrate 21 and expose the fracture 14 to the back surface 21b, and the wafer 20 is cut into a plurality of semiconductor devices along each of the plurality of lines 15, such formation is performed.

[Configuration of Inspection Image Capturing Unit]

Figure 5:
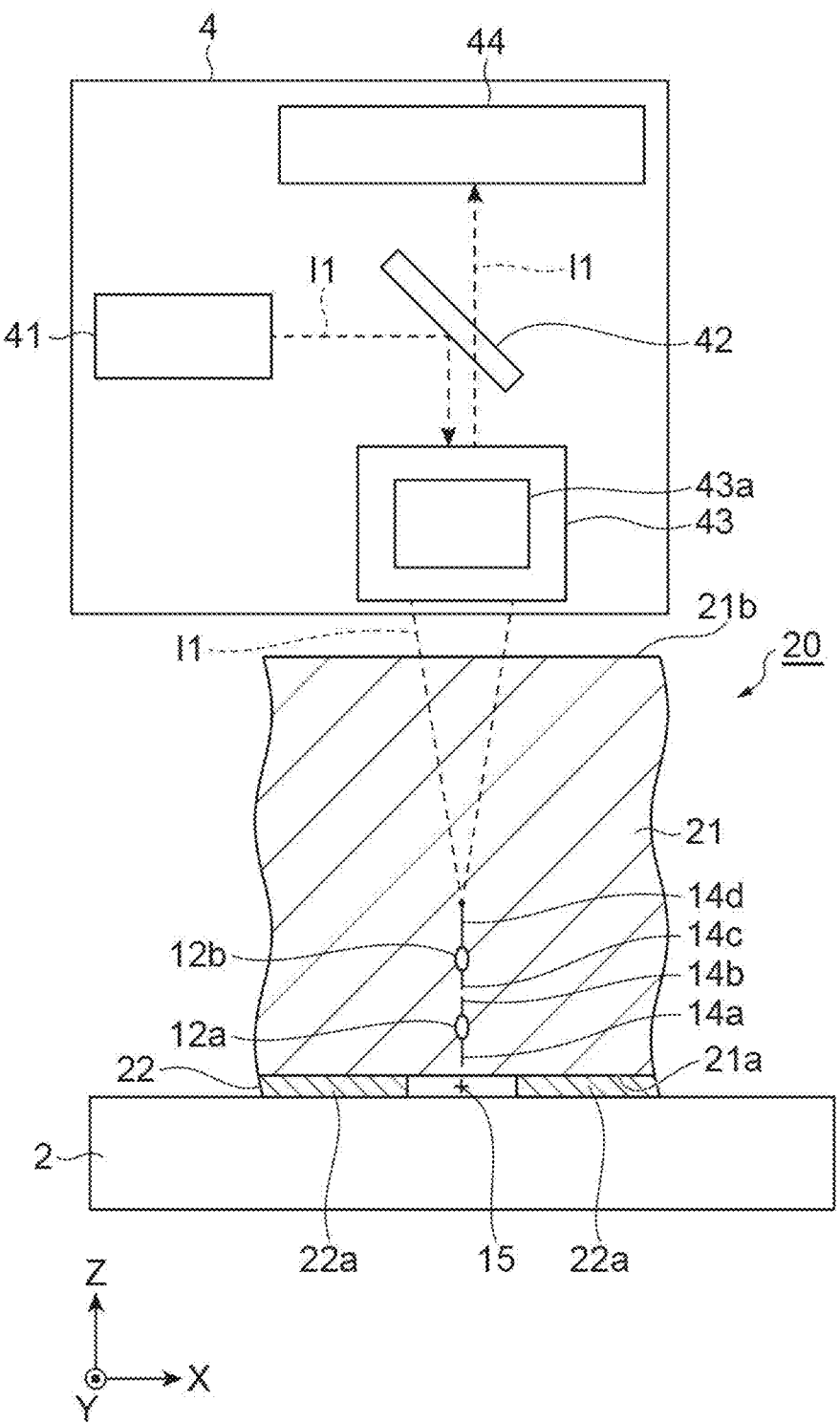
FIG. 5 is a configuration diagram illustrating an inspection image capturing unit illustrated in FIG. 1.

As illustrated in FIG. 5, the image capturing unit 4 includes a light source 41, a mirror 42, an objective lens 43, and a light detection part 44. The light source 41 outputs light I1 having transparency to the semiconductor substrate 21. The light source 41 is configured by, for example, a halogen lamp and a filter, and outputs light I1 in the near infrared region. The light I1 output from the light source 41 is reflected by the mirror 42, passes through the objective lens 43, and then is applied to the wafer 20 from the back surface 21b side of the semiconductor substrate 21. At this time, the stage 2 supports the wafer 20 in which the two rows of modified regions 12a and 12b are formed as described above.

The objective lens 43 passes the light I1 reflected by the front surface 21a of the semiconductor substrate 21 through the objective lens. That is, the objective lens 43 passes the light I1 propagating in the semiconductor substrate 21 through the objective lens. The numerical aperture (NA) of the objective lens 43 is 0.45 or more. The objective lens 43 includes a correction ring 43a. The correction ring 43a corrects the aberration generated in the light I1 in the semiconductor substrate 21 by adjusting the distance between a plurality of lenses constituting the objective lens 43, for example. The light detection part 44 detects the light I1 that has passed through the objective lens 43 and the mirror 42. The light detection part 44 is configured by, for example, an InGaAs camera, and detects the light I1 in the near infrared region.

The image capturing unit 4 is capable of capturing images of each of the two rows of modified regions 12a and 12b and the tip of each of a plurality of fractures 14a to 14d (details will be described later). The fracture 14a is a fracture extending from the modified region 12a to the front surface 21a side. The fracture 14b is a fracture extending from the modified region 12a to the back surface 21b side. The fracture 14c is a fracture extending from the modified region 12b to the front surface 21a side. The fracture 14d is a fracture extending from the modified region 12b to the back surface 21b side. The control unit 8 causes the laser irradiation unit 3 to perform irradiation with the laser light L under the condition that the fracture 14 extending through the two rows of modified regions 12a and 12b reaches the front surface 21a of the semiconductor substrate 21 (see FIG. 4). If the fracture 14 does not reach the front surface 21a due to any problem or the like, the plurality of such fractures 14a to 14d are formed.

[Configuration of Alignment Correction Image Capturing Unit]

Figure 6:
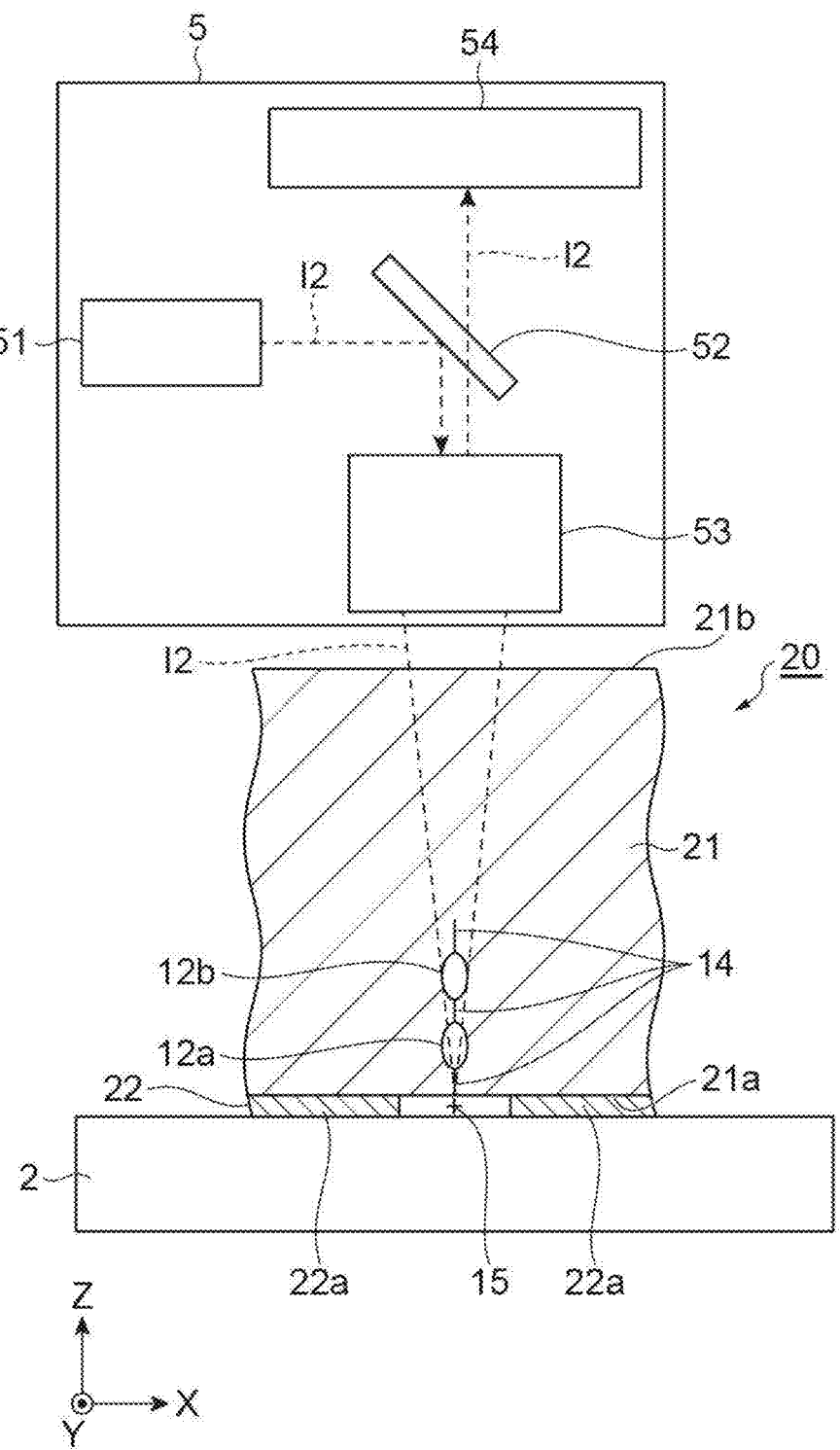
FIG. 6 is a configuration diagram illustrating an alignment correction image capturing unit illustrated in FIG. 1.

As illustrated in FIG. 6, the image capturing unit 5 includes a light source 51, a mirror 52, a lens 53, and a light detection part 54. The light source 51 outputs light I2 having transparency to the semiconductor substrate 21. The light source 51 is configured by, for example, a halogen lamp and a filter, and outputs light I2 in the near infrared region. The light source 51 may be shared with the light source 41 of the image capturing unit 4. The light I2 output from the light source 51 is reflected by the mirror 52, passes through the lens 53, and then is applied to the wafer 20 from the back surface 21b side of the semiconductor substrate 21.

The lens 53 passes the light I2 reflected by the front surface 21a of the semiconductor substrate 21 through the lens. That is, the lens 53 passes the light I2 propagating in the semiconductor substrate 21 through the lens. The numerical aperture of the lens 53 is 0.3 or less.

That is, the numerical aperture of the objective lens 43 in the image capturing unit 4 is more than the numerical aperture of the lens 53. The light detection part 54 detects the light I2 that has passed through the lens 53 and the mirror 52. The light detection part 55 is configured by, for example, an InGaAs camera, and detects the light I2 in the near infrared region.

Under the control of the control unit 8, the image capturing unit 5 captures an image of the functional element layer 22 by irradiating the wafer 20 with the light I2 from the back surface 21b side and detecting the light I2 returning from the front surface 21a (functional element layer 22). Further, similarly, under the control of the control unit 8, the image capturing unit 5 acquires an image of a region including the modified regions 12a and 12b by irradiating the wafer 20 with the light I2 from the back surface 21b side and detecting the light I2 returning from positions at which the modified regions 12a and 12b are formed in the semiconductor substrate 21. The images are used for alignment of the irradiation position of the laser light L. The image capturing unit 6 has the similar configuration to the image capturing unit 5 except that the lens 53 has a lower magnification (for example, 6 times in the image capturing unit 5 and 1.5 times in the image capturing unit 6), and is used for alignment, similar to the image capturing unit 5.

[Image Capturing Principle by Inspection Image Capturing Unit]

Figure 7:
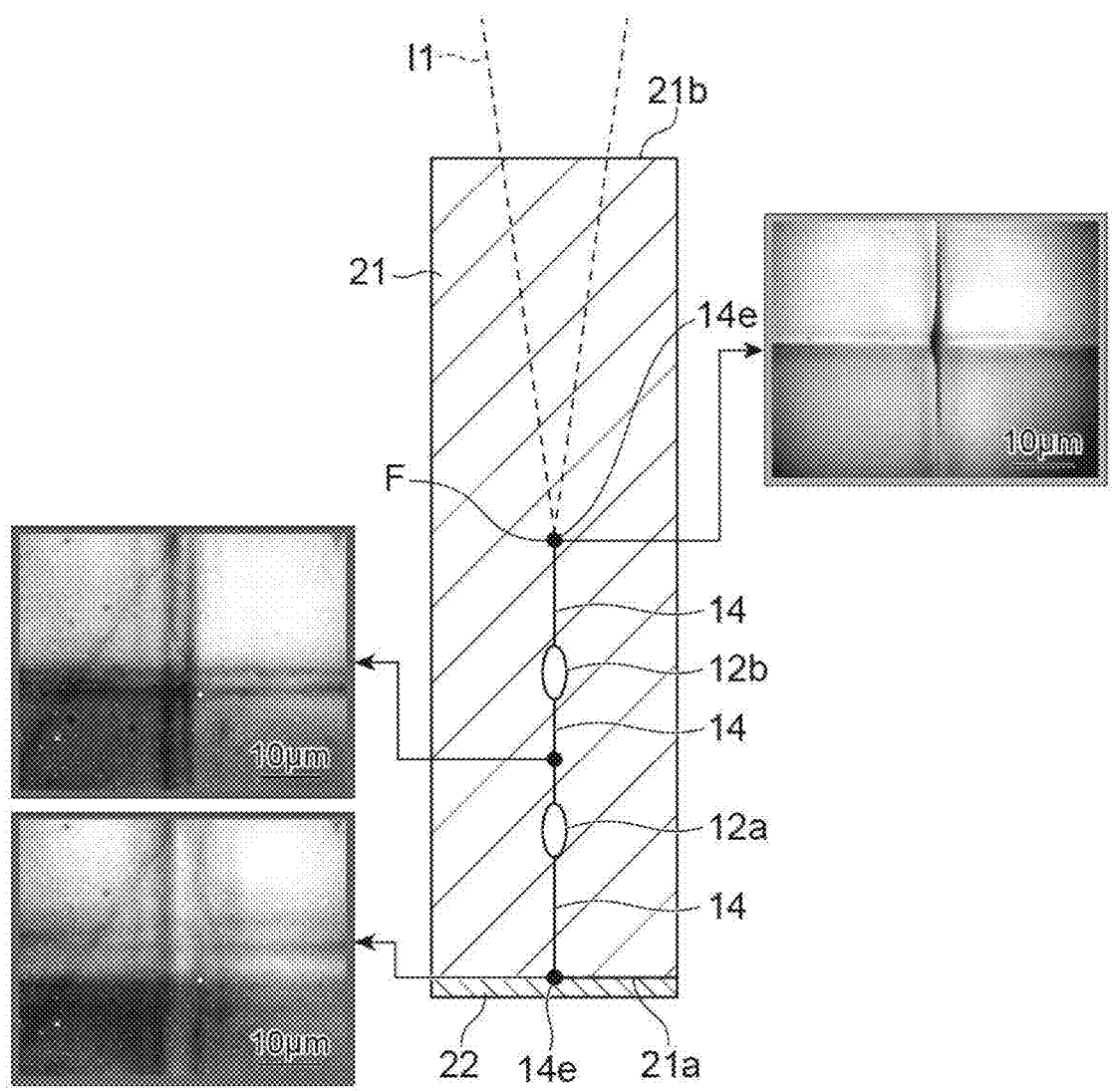
FIG. 7 is a cross-sectional view illustrating a wafer for explaining the image capturing principle by the inspection image capturing unit illustrated in FIG. 5, and is an image at each location by the inspection image capturing unit.

Using the image capturing unit 4 illustrated in FIG. 5, a focus F (focus of the objective lens 43) is moved from the back surface 21b side toward the front surface 21a side for the semiconductor substrate 21 in which the fracture 14 extending through the two rows of modified regions 12a and 12b reaches the front surface 21a, as illustrated in FIG. 7. In this case, if the focus F is aligned from the back surface 21b side to a tip 14e of the fracture 14 extending from the modified region 12b to the back surface 21b side, it is possible to check the tip 14e (image on the right side in FIG. 7). However, even though the focus F is aligned to the fracture 14 itself and the tip 14e of the fracture 14 reaching the front surface 21a from the back surface 21b side, it is not possible to check the fracture and the tip of the fracture (image on the left side in FIG. 7). If the focus F is aligned to the front surface 21a of the semiconductor substrate 21 from the back surface 21b side, it is possible to check the functional element layer 22.

Figure 8:
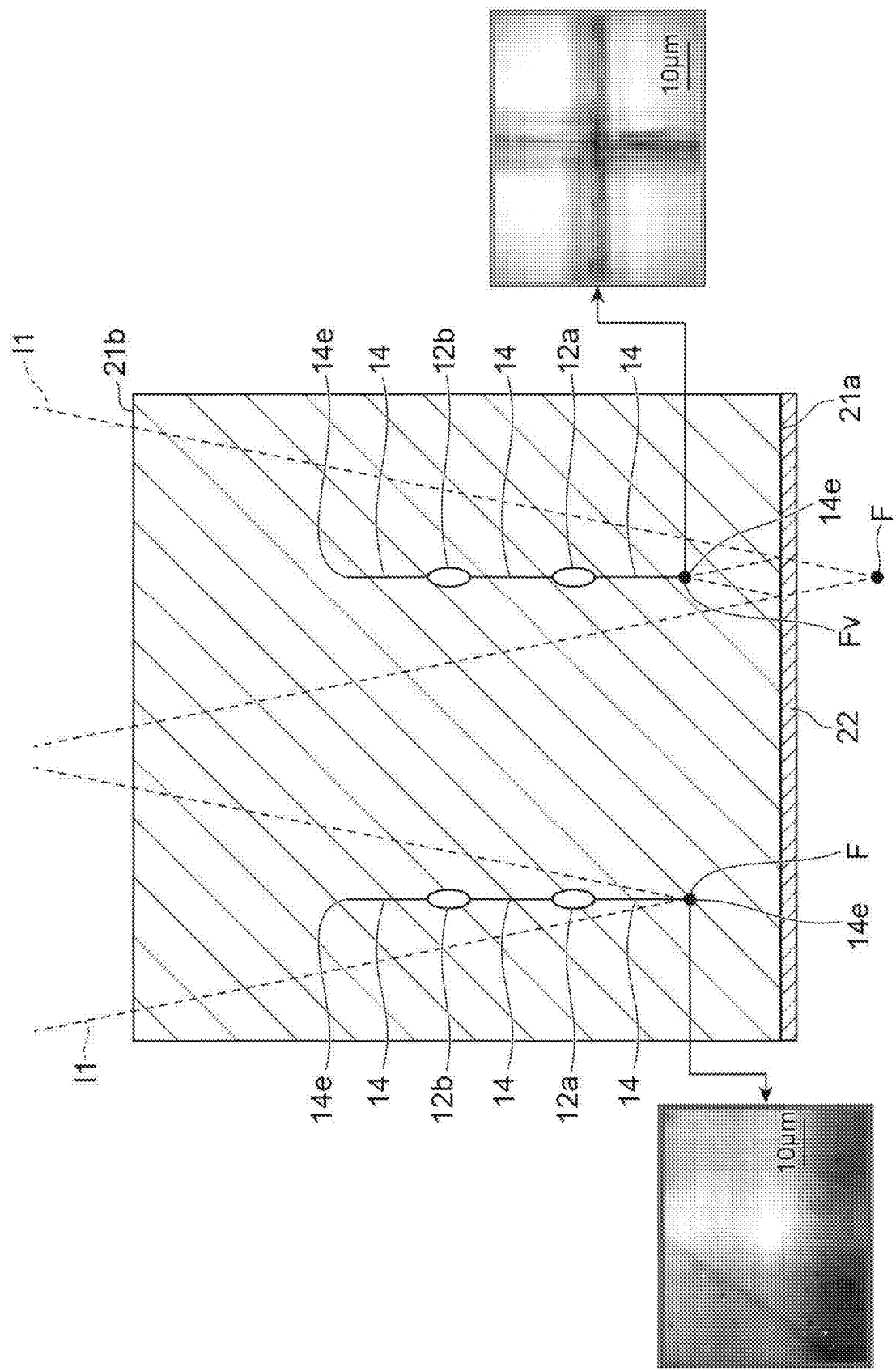
FIG. 8 is a cross-sectional view illustrating the wafer for explaining the image capturing principle by the inspection image capturing unit illustrated in FIG. 5, and is an image at each location by the inspection image capturing unit.

Further, using the image capturing unit 4 illustrated in FIG. 5, the focus F is moved from the back surface 21b side toward the front surface 21a side for the semiconductor substrate 21 in which the fracture 14 extending through the two rows of modified regions 12a and 12b does not reach the front surface 21a, as illustrated in FIG. 8. In this case, even though the focus F is aligned from the back surface 21b side to the tip 14e of the fracture 14 extending from the modified region 12a to the front surface 21a side, it is not possible to check the tip 14e (image on the left side in FIG. 8). However, if the focus F is aligned from the back surface 21b side to a region on an opposite side of the back surface 21b with respect to the front surface 21a (that is, region on the functional element layer 22 side with respect to the front surface 21a), and a virtual focus Fv symmetrical with the focus F with respect to the front surface 21a is located at the tip 14e, it is possible to check the tip 14e (image on the right side in FIG. 8). The virtual focus Fv is a point symmetrical with the focus F with respect to the front surface 21a in consideration of the refractive index of the semiconductor substrate 21.

Figure 9:
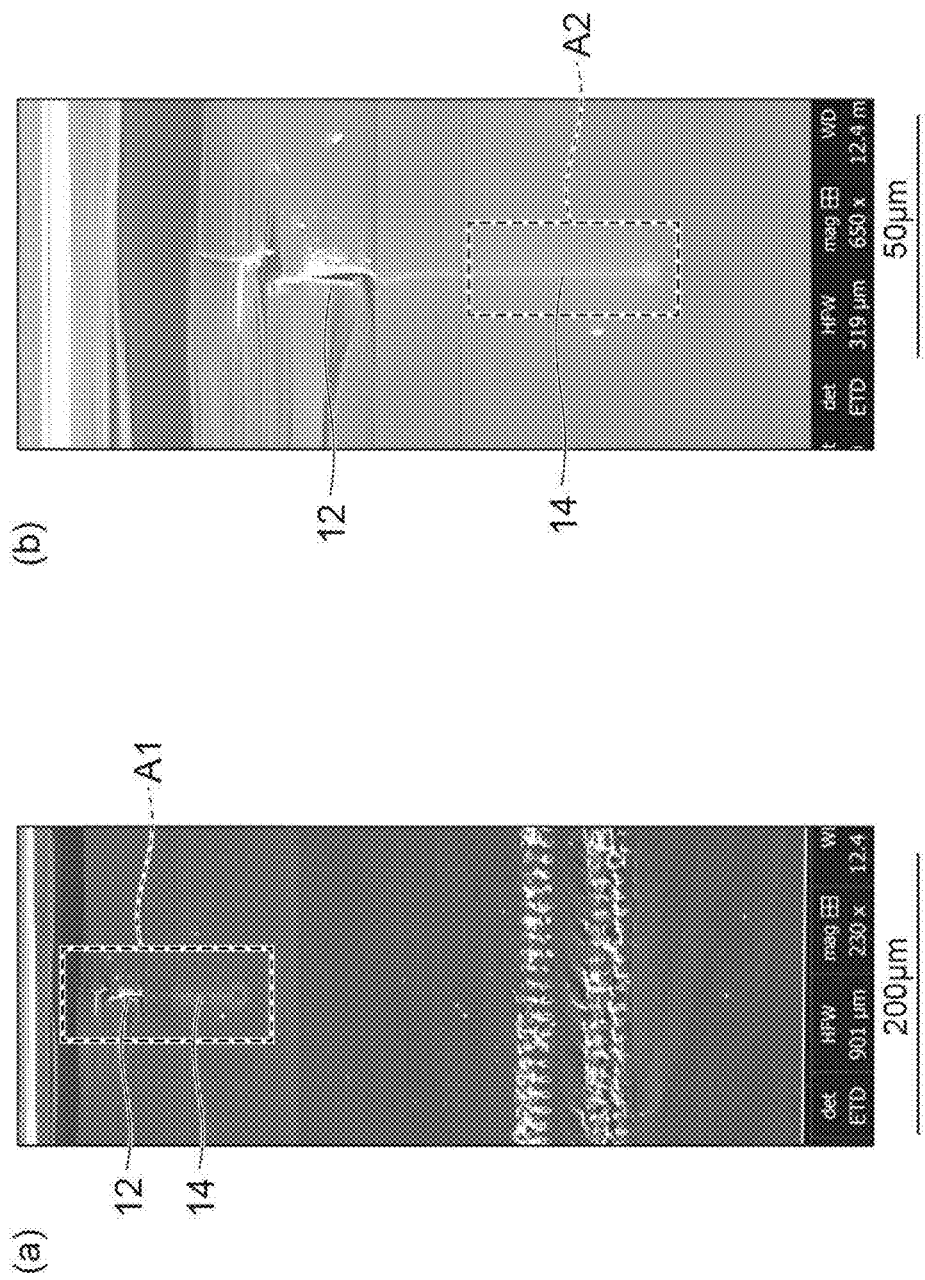
FIG. 9 is an SEM image of a modified region and a fracture formed in a semiconductor substrate.
Figure 10:
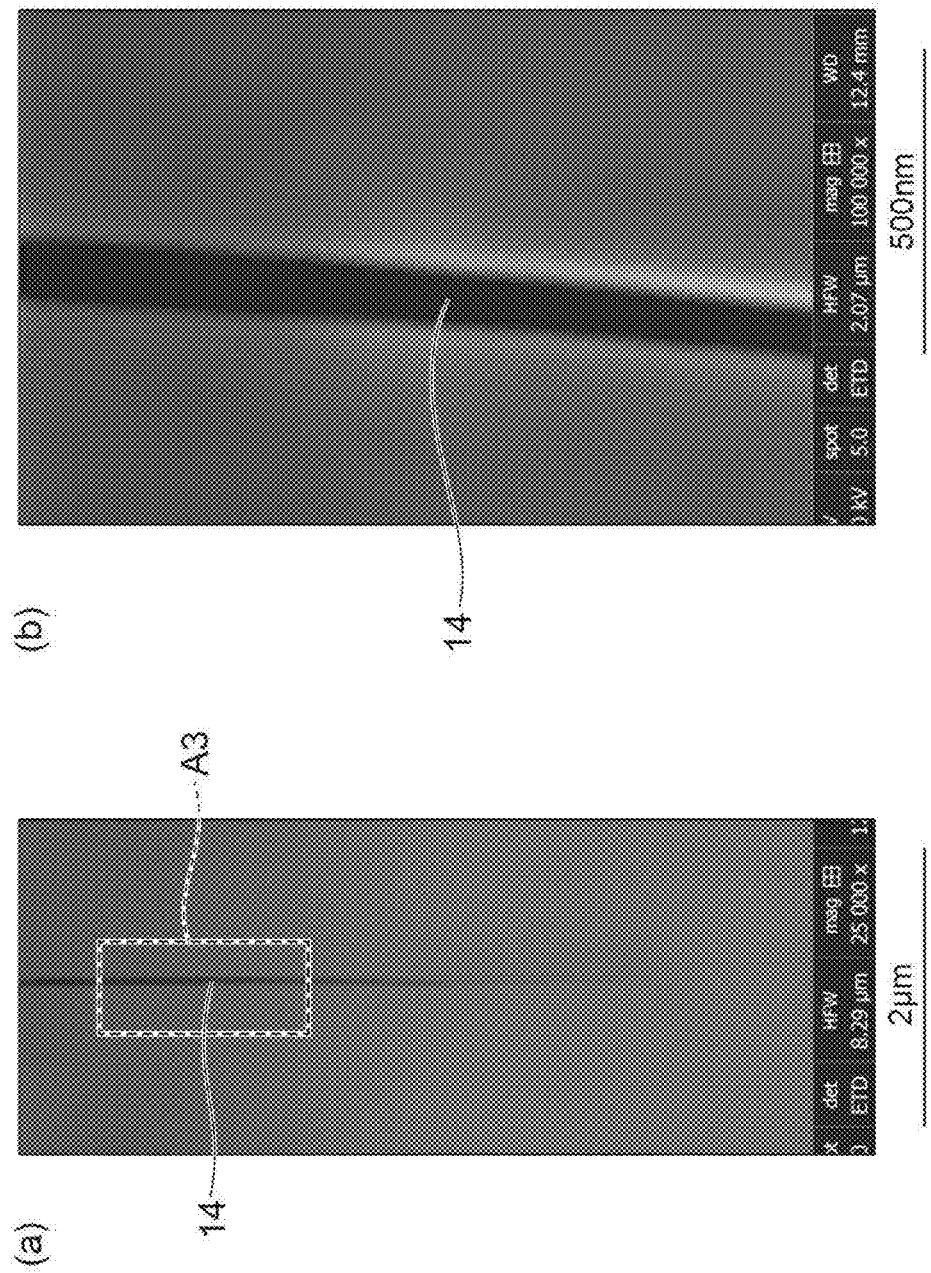
FIG. 10 is an SEM image of the modified region and the fracture formed in the semiconductor substrate.

It is assumed that the reason why it is not possible to check the fracture 14 itself as described above is that the width of the fracture 14 is smaller than the wavelength of the light I1 as the illumination light. FIGS. 9 and 10 are scanning electron microscope (SEM) images of a modified region 12 and the fracture 14 formed in the semiconductor substrate 21 being a silicon substrate. (b) of FIG. 9 is an enlarged image of a region A1 illustrated in (a) of FIG. 9. (a) of FIG. 10 is an enlarged image of a region A2 illustrated in (b) of FIG. 9. (b) of FIG. 10 is an enlarged image of a region A3 illustrated in (a) of FIG. 10. As described above, the width of the fracture 14 is about 120 nm and is smaller than the wavelength (for example, 1.1 to 1.2 µm) of the light I1 in the near infrared region.

Figure 11:
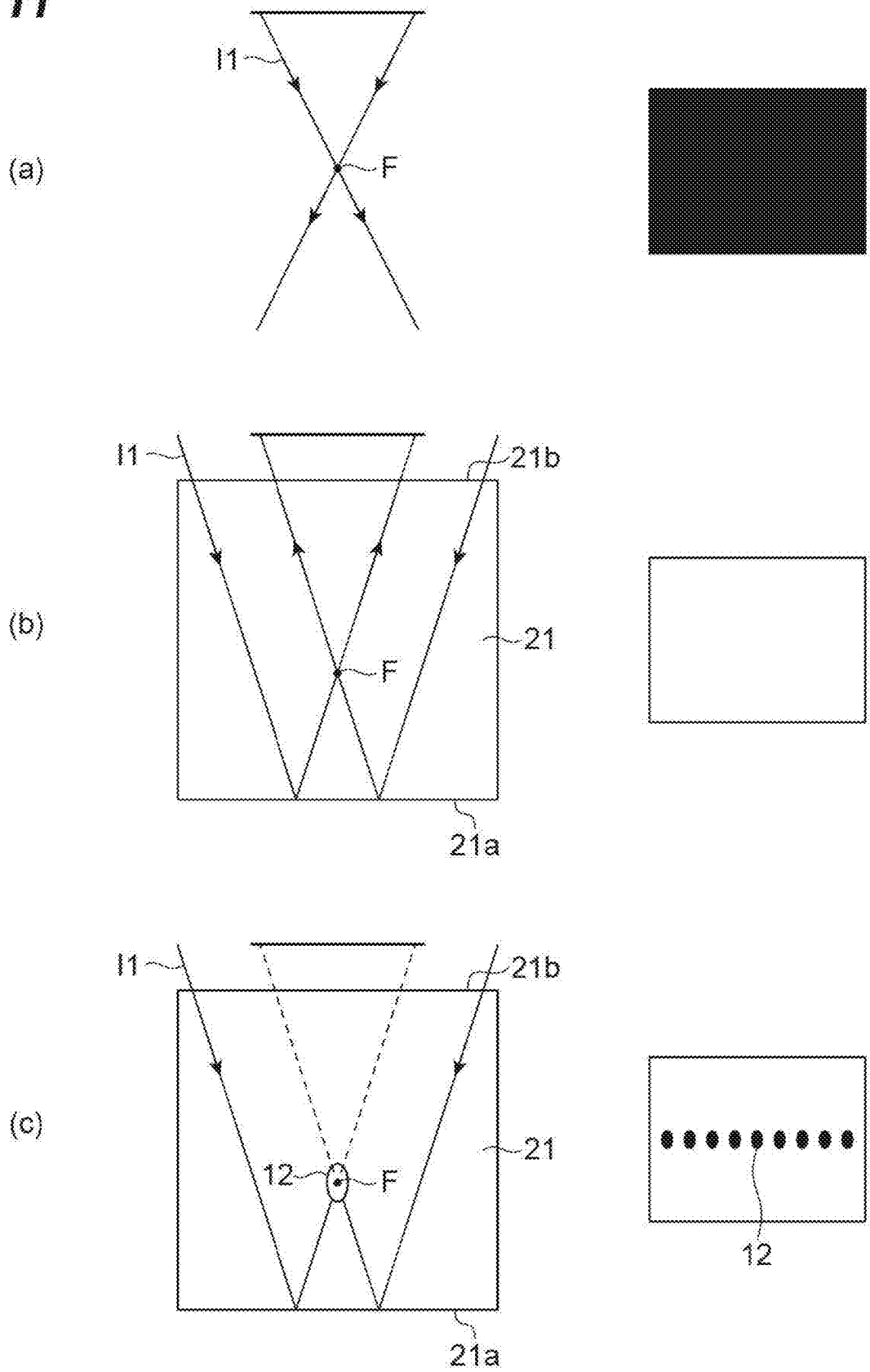
FIG. 11 is an optical path diagram for explaining the image capturing principle by the inspection image capturing unit illustrated in FIG. 5, and is a schematic diagram illustrating an image at a focus by the inspection image capturing unit.

The image capturing principle assumed based on the above description is as follows. As illustrated in (a) of FIG. 11, if the focus F is located in the air, the light I1 does not return, and thus a blackish image is obtained (image on the right side in (a) of FIG. 11). As illustrated in (b) of FIG. 11, if the focus F is located in the semiconductor substrate 21, the light I1 reflected by the front surface 21a is returned, so that a whitish image is obtained (image on the right side in (b) of FIG. 11). As illustrated in (c) of FIG. 11, if the focus F is aligned on the modified region 12 from the back surface 21b side, a portion of the light I1 reflected and returned by the front surface 21a is absorbed, scattered, and the like by the modified region 12. Thus, an image in which the modified region 12 appears blackish in a whitish background is obtained (image on the right side in (c) of FIG. 11).

Figure 12:
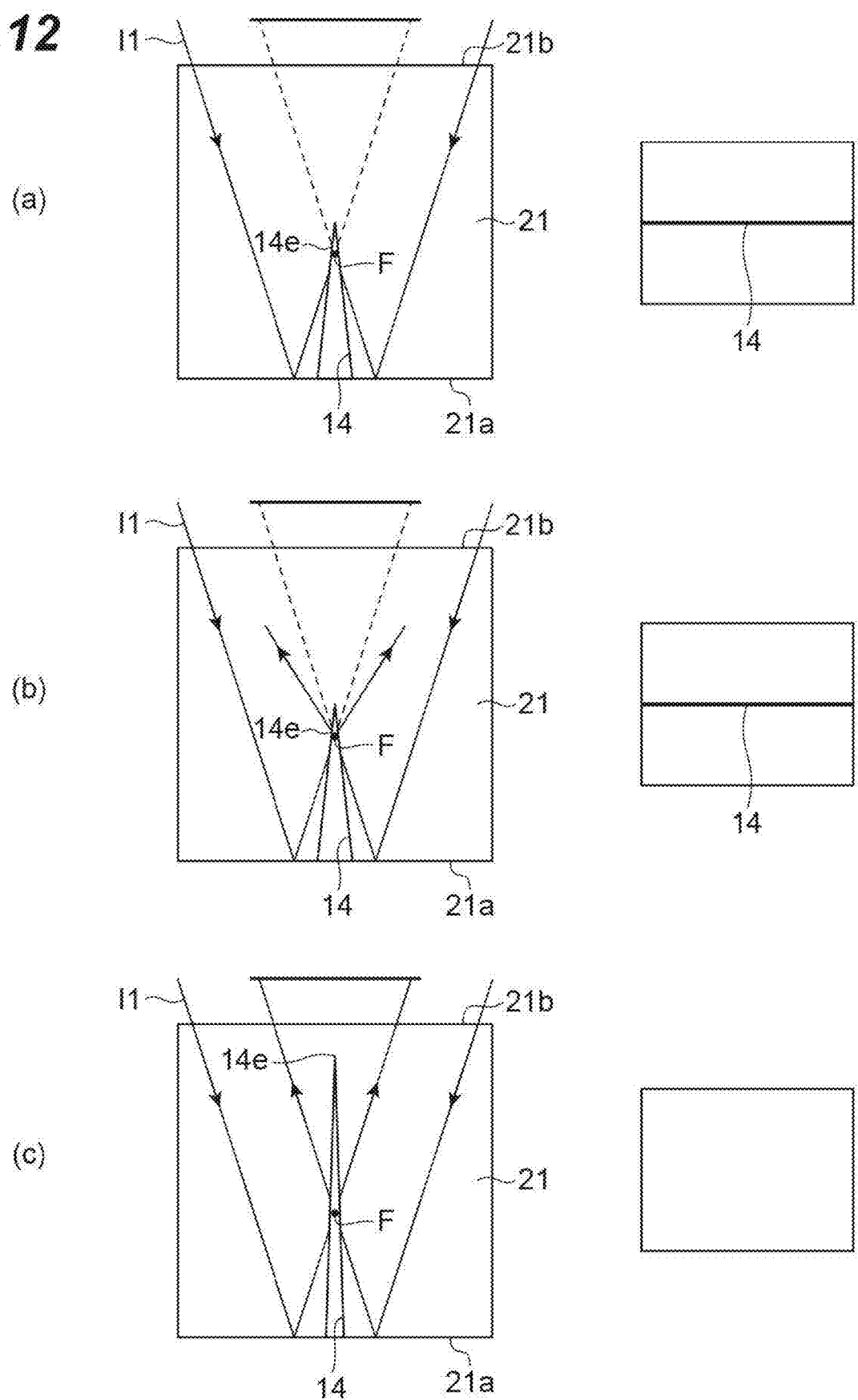
FIG. 12 is an optical path diagram for explaining the image capturing principle by the inspection image capturing unit illustrated in FIG. 5, and is a schematic diagram illustrating an image at the focus by the inspection image capturing unit.

As illustrated in (a) and (b) of FIG. 12, if the focus F is aligned to the tip 14e of the fracture 14 from the back surface 21b side, for example, scattering, reflection, interference, absorption, and the like occurs in a portion of the light I1 reflected and returned by the front surface 21a by the optical specificity (stress concentration, strain, discontinuity of atomic density, and the like), confinement of light, and the like occurring near the tip 14e. Thus, an image in which the tip 14e appears blackish in a whitish background is obtained (images on the right side in (a) and (b) of FIG. 12). As illustrated in (c) of FIG. 12, if the focus F is aligned from the back surface 21b side to a portion of the fracture 14 other than the vicinity of the tip 14e of the fracture 14, at least a portion of the light I1 reflected by the front surface 21a is returned. Thus, a whitish image is obtained (image on the right side in (c) of FIG. 12).

[Inspection Principle by Inspection Image Capturing Unit]

Figure 13:
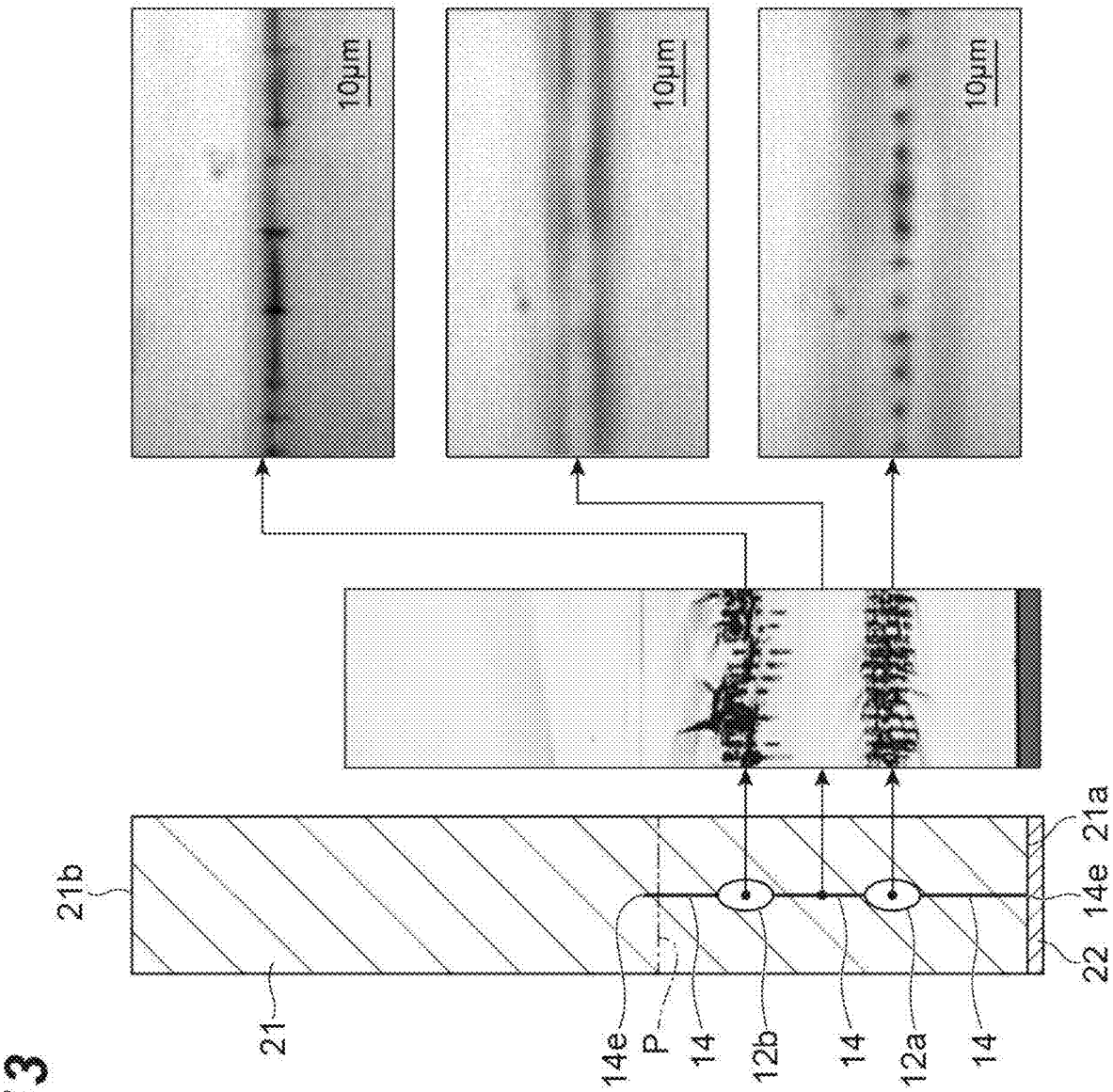
FIG. 13 is a cross-sectional view illustrating a wafer for explaining the inspection principle by the inspection image capturing unit illustrated in FIG. 5, and is an image of a cut surface of the wafer and an image at each location by the inspection image capturing unit.

In a case where, as a result obtained in a manner that the control unit 8 causes the laser irradiation unit 3 to perform irradiation with the laser light L under the condition that the fracture 14 extending through the two rows of the modified regions 12a and 12b reaches the front surface 21a of the semiconductor substrate 21, the fracture 14 extending through the two rows of the modified regions 12a and 12b reaches the front surface 21a as planned, the state of the tip 14e of the fracture 14 is as follows. That is, as illustrated in FIG. 13, the tip 14e of the fracture 14 does not appear in a region between the modified region 12a and the front surface 21a and a region between the modified region 12a and the modified region 12b. The position (simply referred to as a "tip position" below) of the tip 14e of the fracture 14 extending from the modified region 12b to the back surface 21b side is located on the back surface 21b side with respect to a reference position P between the modified region 12b and the back surface 21b.

Figure 14:
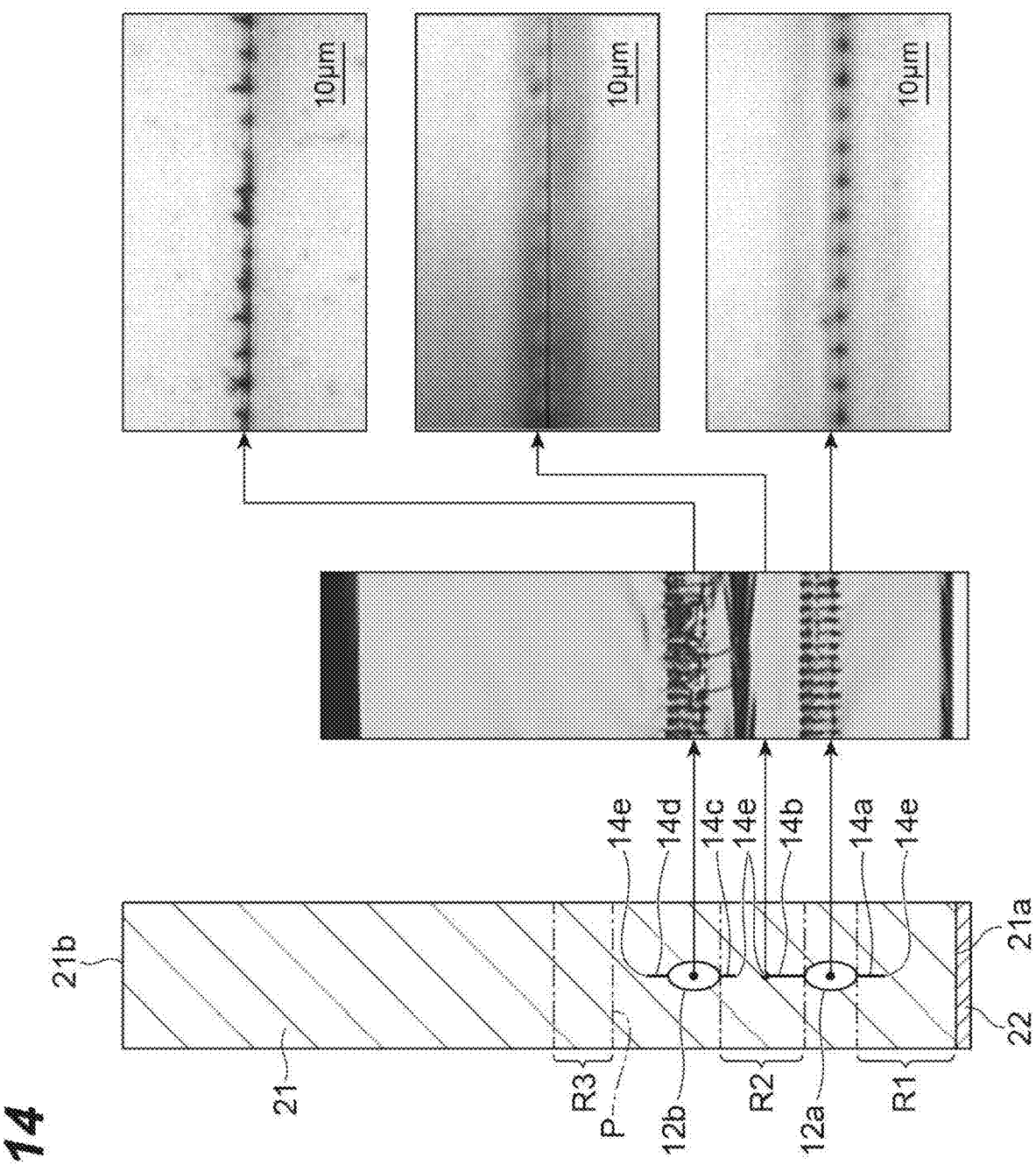
FIG. 14 is a cross-sectional view illustrating a wafer for explaining the inspection principle by the inspection image capturing unit illustrated in FIG. 5, and is an image of a cut surface of the wafer and an image at each location by the inspection image capturing unit.

On the other hand, in a case where, as a result obtained in a manner that the control unit 8 causes the laser irradiation unit 3 to perform irradiation with the laser light L under the condition that the fracture 14 extending through the two rows of the modified regions 12a and 12b reaches the front surface 21a of the semiconductor substrate 21, the fracture 14 extending through the two rows of the modified regions 12a and 12b does not reach the front surface 21a due to any problem, differing from the plan, the state of the tip 14e of the fracture 14 is as follows. That is, as illustrated in FIG. 14, the tip 14e of the fracture 14a extending from the modified region 12a to the front surface 21a side appears in the region between the modified region 12a and the front surface 21a. The tip 14e of the fracture 14b extending from the modified region 12a to the back surface 21b and the tip 14e of the fracture 14c extending from the modified region 12b to the front surface 21a appear in the region between the modified region 12a and the modified region 12b. The tip position of the fracture 14d extending from the modified region 12b to the back surface 21b side is located on the front surface 21a with respect to the reference position P between the modified region 12b and the back surface 21b.

With the above description, if the control unit 8 performs at least one of the following first inspection, second inspection, third inspection, and fourth inspection, it is possible to evaluate whether or not the fracture 14 extending through the two rows of the modified regions 12a and 12b reaches the front surface 21a of the semiconductor substrate 21. The first inspection is an inspection of whether or not, when the region between the modified region 12a and the front surface 21a is set as an inspection region R1, there is the tip 14e of the fracture 14a extending from the modified region 12a to the front surface 21a side, in the inspection region R1. The second inspection is an inspection of whether or not, when the region between the modified region 12a and the modified region 12b is set as an inspection region R2, there is the tip 14e of the fracture 14b extending from the modified region 12a to the back surface 21b side, in the inspection region R2. The third inspection is an inspection of whether or not there is the tip 14e of the fracture 14c extending from the modified region 12b to the front surface 21a side, in the inspection region R2. The fourth inspection is an inspection of whether or not, when a region that extends from the reference position P to the back surface 21b side and does not reach the back surface 21b is set as an inspection region R3, the tip position of the fracture 14d extending from the modified region 12b to the back surface 21b side is located in the inspection region R3.

Each of the inspection region R1, the inspection region R2, and the inspection region R3 can be set based on positions at which the two focusing points C1 and C2 are aligned with respect to the semiconductor substrate 21, before the two rows of modified regions 12a and 12b are formed. In a case where the fracture 14 extending through the two rows of the modified regions 12a and 12b reaches the front surface 21a of the semiconductor substrate 21, the tip position of the fracture 14 extending from the modified region 12b to the back surface 21b side is stable. Thus, the reference position P and the inspection region R3 can be set based on the result of test processing. As illustrated in FIGS. 13 and 14, the image capturing unit 4 is capable of capturing an image of each of the two modified regions 12a and 12b. Thus, after the two rows of modified regions 12a and 12b are formed, each of the inspection region R1, the inspection region R2, and the inspection region R3 may be set based on the respective positions of the two modified regions 12a and 12b.

[Laser processing method and Method for Manufacturing Semiconductor Device]

The method for manufacturing a semiconductor device in the present embodiment will be described with reference to FIG. 15. The method for manufacturing a semiconductor device in the present embodiment includes the laser processing method performed in the laser processing device 1.

Firstly, a wafer 20 is prepared and placed on the stage 2 of the laser processing device 1. Then, the laser processing device 1 irradiates the wafer 20 with laser light L from the back surface 21b side of a semiconductor substrate 21 along each of a plurality of lines 15, so as to form two rows of modified regions 12a and 12b in the semiconductor substrate 21 along each of the plurality of lines 15 (S01, first step). In this step, the laser processing device 1 irradiates the wafer 20 with the laser light L from the back surface 21b side of the semiconductor substrate 21 along each of the plurality of lines 15 under a condition that fracture 14 extending through the two rows of modified regions 12a and 12b reaches the front surface 21a of the semiconductor substrate 21.

Then, the laser processing device 1 inspects the tip position of the fracture 14d extending from the modified region 12b to the back surface 21b side, in the inspection region R3 between the modified region 12b and the back surface 21b (S02, second step). In this step, the laser processing device 1 inspects whether or not the tip position of the fracture 14d is located in the inspection region R3, by aligning the focus F from the back surface 21b side in the inspection region R3 and detecting the light I1 propagating in the semiconductor substrate 21 from the front surface 21a side to the back surface 21b side. As described above, in the present embodiment, the laser processing device 1 performs the fourth inspection.

More specifically, the objective lens 43 of the image capturing unit 4 aligns the focus F from the back surface 21b side in the inspection region R3, and the light detection part 44 of the image capturing unit 4 detects the light I1 propagating in the semiconductor substrate 21 from the front surface 21a side to the back surface 21b side. At this time, the drive unit 7 moves the image capturing unit 4 along the Z-direction, and the focus F is relatively moved in the inspection region R3 along the Z-direction. Thus, the light detection part 44 acquires image data at each location in the Z-direction. The control unit 8 inspects whether or not the tip position of the fracture 14d is located in the inspection region R3, based on a signal output from the light detection part 44 (that is, image data at each location in the Z-direction). As described above, in the present embodiment, the control unit 8 functions as the inspection part, and the stage 2, the image capturing unit 4, and the control unit 8 function as the inspecting device 10.

Then, the control unit 8 evaluates the processing result in Step S01 based on the inspection result in Step S02 (S03, third step). In this step, in a case where the tip position of the fracture 14d is located in the inspection region R3, the tip position of the fracture 14d is located on the back surface 21b side with respect to the reference position P, so that the control unit 8 evaluates that the fracture 14 extending through the two rows of modified regions 12*a* and 12*b* reaches the front surface 21*a* of the semiconductor substrate 21. On the other hand, in a case where the tip position of the fracture 14*d* is not located in the inspection region R3, it is considered that the tip position of the fracture 14*d* is located on the front surface 21*a* side with respect to the reference position P, and the control unit 8 evaluates that the fracture 14 extending through the two rows of modified regions 12*a* and 12*b* does not reach the front surface 21*a* of the semiconductor substrate 21.

In a case where it is evaluated that the fracture 14 extending through the two rows of the modified regions 12*a* and 12*b* reaches the front surface 21*a* of the semiconductor substrate 21, the control unit 8 performs an acceptance process (S04). In this step, the control unit 8 performs, as the acceptance process, for example, display of the acceptance with a display of the laser processing device 1, display of image data with the display, recording of the acceptance with a storage unit of the laser processing device 1 (storing as a log), and storing of image data with the storage unit. As described above, the display in the laser processing device 1 functions as a notification unit for notifying an operator of the acceptance.

On the other hand, in a case where it is evaluated that the fracture 14 extending through the two rows of the modified regions 12*a* and 12*b* does not reach the front surface 21*a* of the semiconductor substrate 21, the control unit 8 performs a rejection process (S05). In this step, the control unit 8 performs, as the rejection process, for example, lighting of the rejection with a lamp of the laser processing device 1, display of the rejection with the display of the laser processing device 1, and recording of the rejection with the storage unit of the laser processing device 1 (storing as a log). As described above, at least one of the lamp and the display in the laser processing device 1 functions as the notification unit for notifying the operator of the rejection.

The above Steps S01 to S05 corresponds to the laser processing method performed in the laser processing device 1. A timing of performing the fourth inspection is not limited to a timing after the two rows of modified regions 12*a* and 12*b* are formed in the semiconductor substrate 21 along each of all lines 15. The timing for the fourth inspection may be a timing after the modified regions 12*a* and 12*b* are formed along a plurality of lines 15 extending in one direction or a timing which is a timing before the modified regions 12*a* and 12*b* are further formed along a plurality of lines 15 extending in one direction and at which alignment of an irradiation position of the line 15 extending in one direction with laser light L is performed. Alternatively, the timing of performing the fourth inspection may be a timing at which switching is performed from formation of the modified regions 12*a* and 12*b* along each of a plurality of lines 15 extending in one direction to formation of the modified regions 12*a* and 12*b* along each of a plurality of lines 15 extending in different directions. A location at which the fourth inspection is performed may be at least one of a plurality of lines 15 set in a grid. However, in a case where switching is performed from the formation of modified regions 12*a* and 12*b* along each of the plurality of lines 15 extending in one direction to the formation of modified regions 12*a* and 12*b* along each of the plurality of lines 15 extending in different directions, the location at which the fourth inspection is performed is preferably a location other than an intersection of the lines 15 extending in different directions (intersection of the line 15 extending in the different direction with each of the plurality of lines 15 extending in one direction). This is because the state of the fracture 14 tends to be unstable at the intersection of the line 15 extending in the different direction.

In a case where the acceptance process in Step S04 is performed (that is, in a case where it is evaluated in Step 03 that the fracture 14 extending through the two rows of the modified regions 12*a* and 12*b* reaches the front surface 21*a* of the semiconductor substrate 21), a grinding device grinds the back surface 21*b* of the semiconductor substrate 21 to expose the fracture 14 extending through the two rows of the modified regions 12*a* and 12*b* to the back surface 21*b* and to cut the wafer 20 into a plurality of semiconductor devices along each of the plurality of lines 15 (S06, fourth step).

The above Steps S01 to S06 corresponds to the method for manufacturing a semiconductor device, which includes the laser processing method performed in the laser processing device 1. In a case where the rejection process in Step S05 is performed (that is, in a case where it is evaluated in Step 03 that the fracture 14 extending through the two rows of the modified regions 12*a* and 12*b* does not reach the front surface 21*a* of the semiconductor substrate 21), examination and adjustment of the laser processing device 1, re-laser processing (recovery processing) on the wafer 20, and the like are performed.

Figure 16:
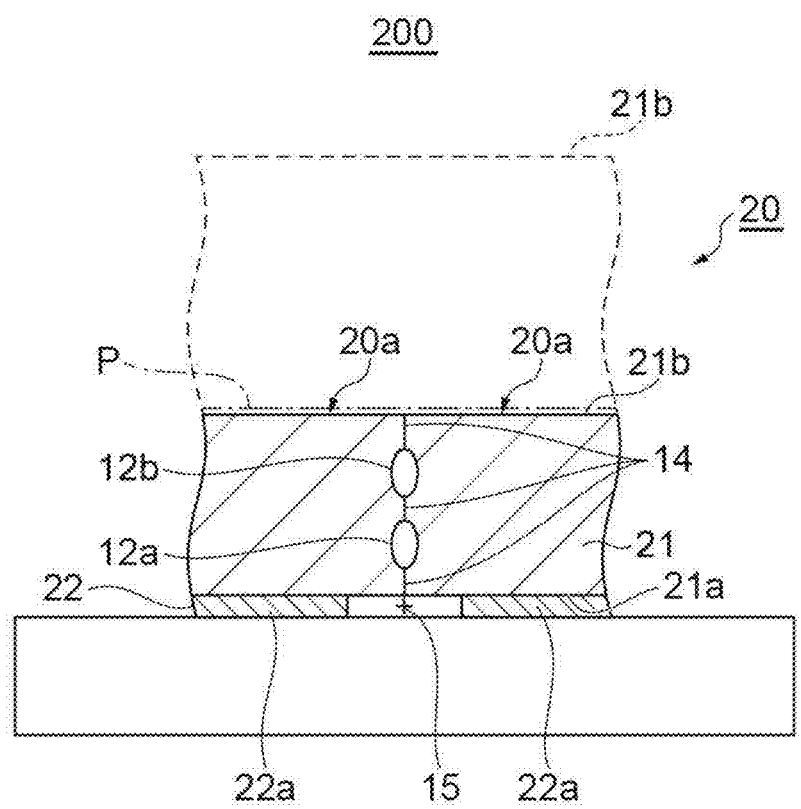
FIG. 16 is a cross-sectional view illustrating a portion of a wafer in grinding and cutting steps in the method for manufacturing a semiconductor device illustrated in FIG. 15.

Here, grinding and cutting of the wafer 20 in Step S06 will be described more specifically. As illustrated in FIG. 16, a grinding device 200 grinds (polishes) the back surface 21*b* of the semiconductor substrate 21 to thin the semiconductor substrate 21 and expose the fracture 14 to the back surface 21*b*, and the wafer 20 is cut into a plurality of semiconductor devices 20*a* along each of the plurality of lines 15. In this step, the grinding device 200 grinds the back surface 21*b* of the semiconductor substrate 21 to the reference position P for the fourth inspection.

As described above, in a case where the fracture 14 extending through the two rows of the modified regions 12*a* and 12*b* reaches the front surface 21*a* of the semiconductor substrate 21, the tip position of the fracture 14 extending from the modified region 12*b* to the back surface 21*b* side is located on the back surface 21*b* side with respect to the reference position P. Therefore, it is possible to expose the fracture 14 extending through the two rows of modified regions 12*a* and 12*b* to the back surface 21*b* by grinding the back surface 21*b* of the semiconductor substrate 21 to the reference position P. In other words, using a position at which an end of grinding is planned, as the reference position P, the wafer 20 is irradiated with laser light L from the back surface 21*b* side of the semiconductor substrate 21 along each of the plurality of lines 15 under the condition that the fracture 14 extending through the two rows of modified regions 12*a* and 12*b* reaches the front surface 21*a* of the semiconductor substrate 21 and the reference position P.

Figure 17:
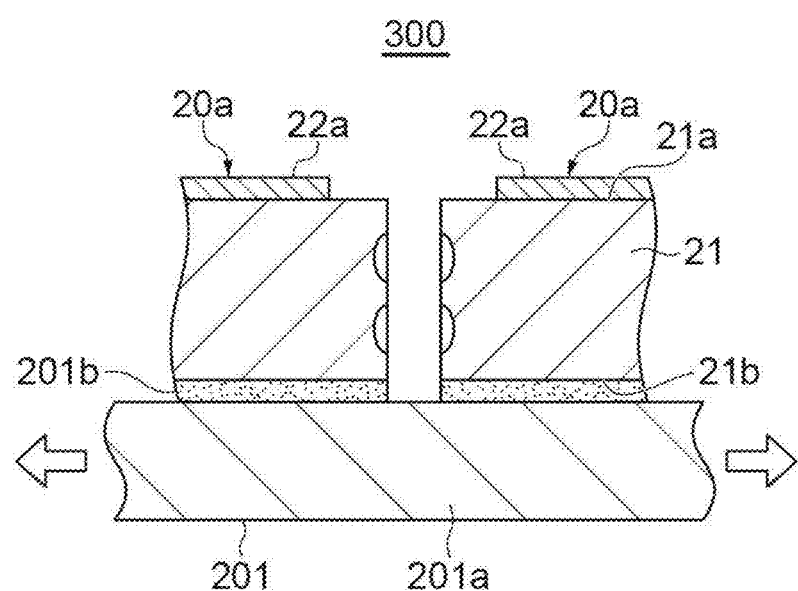
FIG. 17 is a cross-sectional view illustrating a portion of a wafer in grinding and cutting steps in the method for manufacturing a semiconductor device illustrated in FIG. 15.

As illustrated in FIG. 17, an expanding device 300 expands an expanding tape 201 attached to the back surface 21*b* of the semiconductor substrate 21 to separate the plurality of semiconductor devices 20*a* from each other. The expanding tape 201 is, for example, a die attach film (DAF) configured by a base material 201*a* and an adhesive layer 201*b*. In this case, the adhesive layer 201*b* disposed between the back surface 21*b* of the semiconductor substrate 21 and the base material 201*a* is cut into the semiconductor devices 20*a* by the expansion of the expanding tape 201. The cut adhesive layer 201*b* is picked up together with the semiconductor device 20*a*.

[Actions and Effects]

In the laser processing method described above, the focus F is aligned from the back surface 21b side in the inspection region R3 between the modified region 12b and the back surface 21b of the semiconductor substrate 21, and the light I1 propagating in the semiconductor substrate 21 from the front surface 21a side to the back surface 21b side is detected. By detecting the light I1 in this manner, it is possible to check the tip position of the fracture 14d extending from the modified region 12b to the back surface 21b side in the inspection region R3. In a case where the tip position of the fracture 14d is located on the front surface 21a side with respect to the reference position P, it is assumed that the fracture 14 extending through the two rows of modified regions 12a and 12b does not reach the front surface 21a of the semiconductor substrate 21. Thus, according to the laser processing method described above, it is possible to check whether or not the fracture 14 extending through the two rows of modified regions 12a and 12b reaches the front surface 21a of the semiconductor substrate 21.

Further, in the above-described laser processing method, it is evaluated that the fracture 14 extending through the two rows of modified regions 12a and 12b reaches the front surface 21a of the semiconductor substrate 21 in a case where the tip position of the fracture 14d is not located on the front surface 21a side with respect to the reference position P, and it is evaluated that the fracture 14 extending through the two rows of modified regions 12a and 12b does not reach the front surface 21a of the semiconductor substrate 21 in a case where the tip position of the fracture 14d is located on the front surface 21a side with respect to the reference position P. Accordingly, it is possible to determine an embodiment of the subsequent steps based on the evaluation result.

Further, in the above-described laser processing method, when the region that extends from the reference position P to the back surface 21b side and does not reach the back surface 21b is set as the inspection region R3, it is evaluated that the fracture 14 extending through the two rows of modified regions 12a and 12b reaches the front surface 21a of the semiconductor substrate 21 in a case where the tip position of the fracture 14d is located in the inspection region R3, and it is evaluated that the fracture 14 extending through the two rows of modified regions 12a and 12b does not reach the front surface 21a of the semiconductor substrate 21 in a case where the tip position of the fracture 14d is not located in the inspection region R3. The tip position of the fracture 14d is more stable in a case where the fracture 14 extending through the two rows of modified regions 12a and 12b does not reach the front surface 21a of the semiconductor substrate 21 than a case where when the fracture 14 extending through the two rows of modified regions 12a and 12b reaches the front surface 21a of the semiconductor substrate 21. Thus, it is possible to efficiently inspect the fracture 14 extending through the two rows of modified regions 12a and 12b by setting the region that extends from the reference position P to the back surface 21b side and does not reach the back surface 21b, as the inspection region R3.

Further, in the laser processing method described above, the two rows of modified regions 12a and 12b are formed as the plurality of rows of modified regions 12. Thus, it is possible to efficiently perform the formation of a plurality of rows of modified regions 12 and the inspection of the fracture 14 extending through the plurality of rows of modified regions 12.

Further, according to the above-described method for manufacturing a semiconductor device, in a case where it is evaluated that the fracture 14 extending through the two rows of modified regions 12a and 12b does not reach the front surface 21a of the semiconductor substrate 21, the back surface 21b of the semiconductor substrate 21 is not ground. Thus, it is possible to prevent an occurrence of a situation in which it is not possible to reliably cut a wafer 20 along each of a plurality of lines 15 after the grinding step.

Further, in the above-described method for manufacturing a semiconductor device, the back surface 21b of the semiconductor substrate 21 is ground up to the reference position P. According to this, it is possible to reliably cut the wafer 20 along each of the plurality of lines 15.

Further, the inspecting device 10 aligns the focus F from the back surface 21b side in the inspection region R3 between the modified region 12b and the back surface 21b of the semiconductor substrate 21, and detects the light I1 propagating in the semiconductor substrate 21 from the front surface 21a side to the back surface 21b side. By detecting the light I1 in this manner, it is possible to check the tip position of the fracture 14d in the inspection region R3.

Further, in the inspecting device 10, the numerical aperture of the objective lens 43 is 0.45 or more. Thus, it is possible to more reliably check the tip position of the fracture 14d in the inspection region R3.

Further, in the inspecting device 10, the objective lens 43 includes the correction ring 43a. Thus, it is possible to more reliably check the tip position of the fracture 14d in the inspection region R3.

MODIFICATION EXAMPLES

The present disclosure is not limited to the above embodiment.

Figure 15:
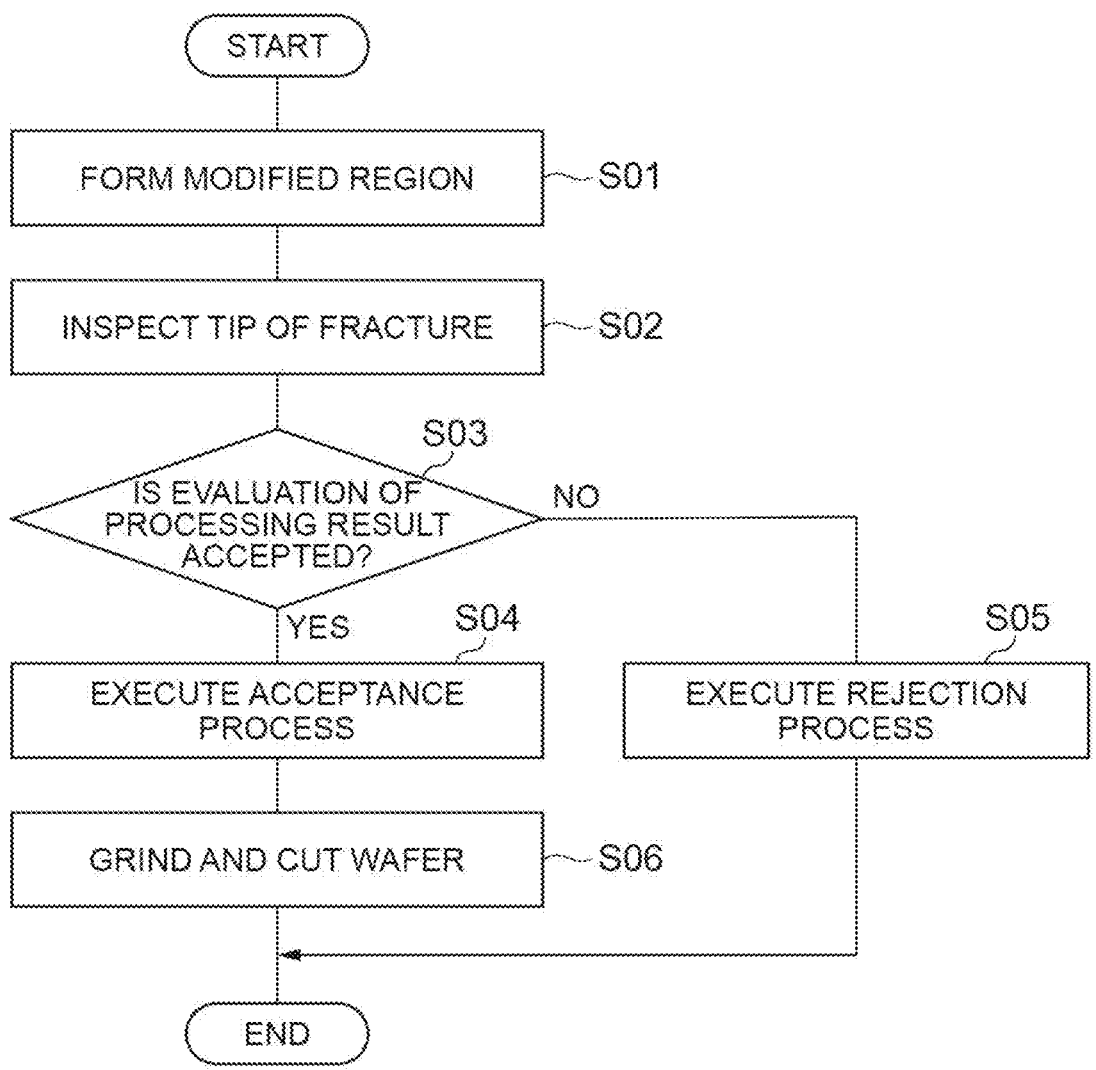
FIG. 15 is a flowchart illustrating a method for manufacturing a semiconductor device in the embodiment.

For example, in the inspection step of Step S02 illustrated in FIG. 15, the control unit 8 may perform at least one inspection of the first inspection, the second inspection, and the third inspection in addition to the fourth inspection described above. In the fourth inspection, for example, the entire region between the modified region 12b and the back surface 21b may be set as the inspection region R3, and it may be inspected whether or not the tip position of the fracture 14d is located on the back surface 21b side with respect to the reference position P.

In the above-described embodiment, the laser processing device 1 forms two rows of modified regions 12a and 12b in the semiconductor substrate 21 along each of the plurality of lines 15, but the laser processing device 1 may form three or more rows of modified regions 12 in the semiconductor substrate 21 along each of the plurality of lines 15. The number of rows, positions, and the like of modified regions 12 formed for one line 15 can be appropriately set in consideration of the thickness of the semiconductor substrate 21 in the wafer 20, the thickness of the semiconductor substrate 21 in a semiconductor device 20a, and the like. A plurality of rows of modified regions 12 may be formed by performing the relative movement of the focusing point C of the laser light L a plurality of number of times for one line 15.

Further, in the grinding and cutting step of Step S06 illustrated in FIG. 15, the grinding device 200 may grind the back surface 21b of the semiconductor substrate 21 beyond the reference position P. The position at which an end of grinding is planned can be appropriately set depending on whether or not the modified region 12 is left on the side surface (cut surface) of the semiconductor device 20a. In a case where the semiconductor device 20a is, for example, a dynamic random access memory (DRAM), the modified region 12 may remain on the side surface of the semiconductor device 20a.

Figure 18:
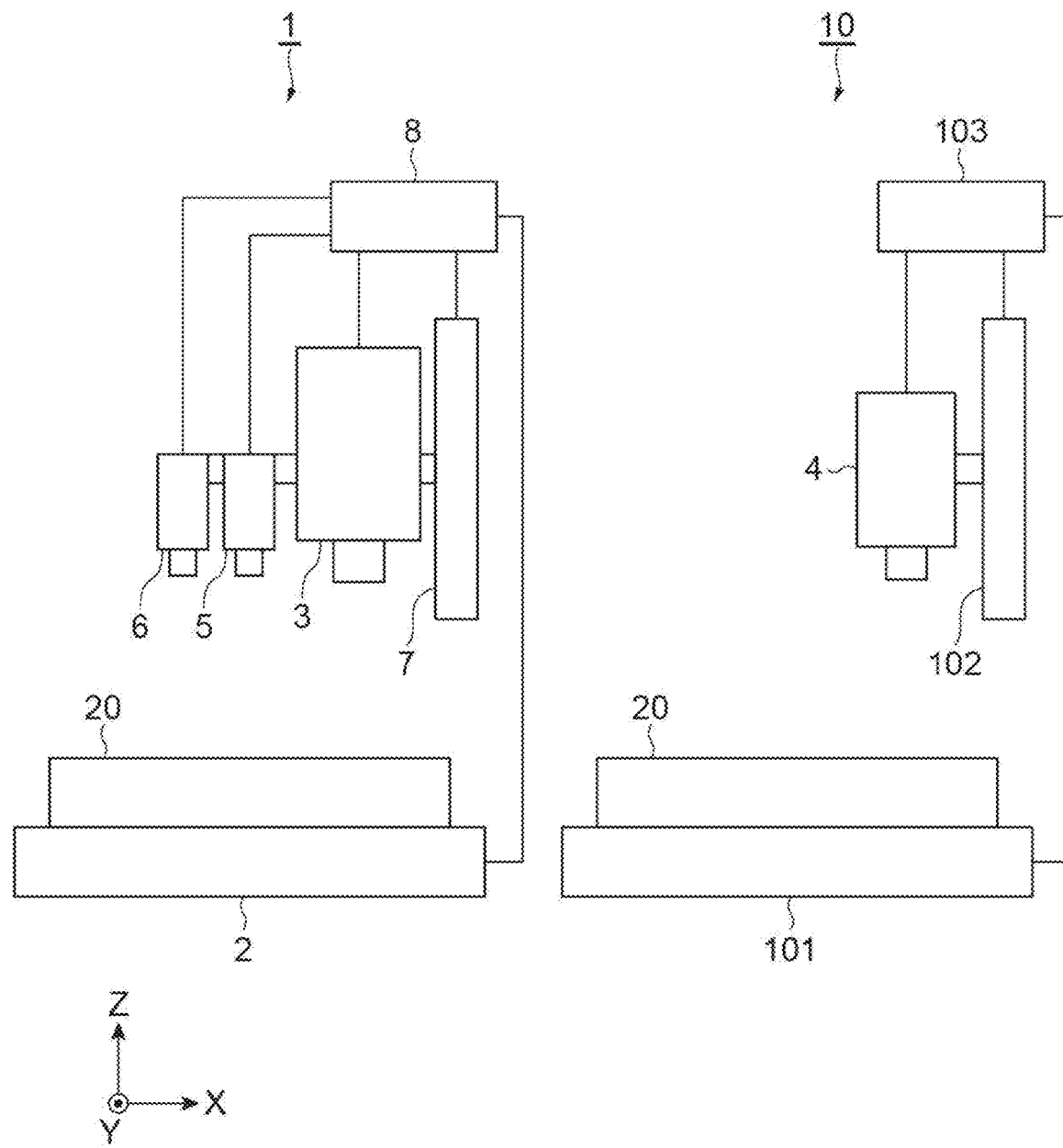
FIG. 18 is a configuration diagram illustrating a laser processing system including an inspecting device according to a modification example.

Further, as illustrated in FIG. 18, the inspecting device 10 may be configured as a separate body from the laser processing device 1.

The inspecting device 10 illustrated in FIG. 18 includes a stage 101, a drive unit 102, and a control unit 103 in addition to the image capturing unit 4. The stage 101 is configured similar to the stage 2 described above, and supports a wafer 20 in which a plurality of rows of modified regions 12 are formed. The drive unit 102 supports the image capturing unit 4 and moves the image capturing unit 4 along the Z-direction. The control unit 103 is configured similar to the control unit 8 described above, and functions as the inspection part. In a laser processing system illustrated in FIG. 18, the wafer 20 is transported between the laser processing device 1 and the inspecting device 10 by a transporting device such as a robot hand.

In addition, the irradiation condition of the laser light L when the wafer 20 is irradiated with the laser light L from the back surface 21b side of the semiconductor substrate 21 along each of the plurality of lines 15 are not limited to those described above. For example, as described above, the irradiation conditions of the laser light L may include a condition that the fracture 14 extending through a plurality of rows of the modified regions 12 (for example, two rows of modified regions 12a and 12b) reaches an interface between the semiconductor substrate 21 and the functional element layer 22. Alternatively, the irradiation condition of the laser light L may be a condition that the fracture 14 extending through a plurality of rows of the modified regions 12 reaches the front surface of the functional element layer 22 on an opposite side of the semiconductor substrate 21. Alternatively, the irradiation condition of the laser light L may be a condition that the fracture 14 extending through a plurality of rows of the modified regions 12 reaches the vicinity of the front surface 21a in the semiconductor substrate 21. As described above, the irradiation condition of the laser light L may be any condition as long as the fracture 14 extending through a plurality of rows of modified regions 12 is formed. In any case, it is possible to check whether or not the fracture 14 extending through a plurality of rows of modified regions 12 is sufficiently extend to the front surface 21a side of the semiconductor substrate 21.

Various materials and shapes can be applied to each configuration in the above-described embodiment without being limited to the above-described materials and shapes. Further, the configurations in the embodiment or the modification examples described above can be randomly applied to the configuration in another embodiment or modification examples.

REFERENCE SIGNS LIST 2 stage
8 control unit (inspection part)
10 inspecting device
12, 12a, 12b modified region
14, 14d fracture
14e tip
15 line
20 wafer
20a semiconductor device
21 semiconductor substrate
21a front surface
21b back surface
22 functional element layer
22a functional element
41 light source
43 objective lens
43a correction ring
44 light detection part
F focus
I1 light
L laser light
P reference position
R3 inspection region

The invention claimed is:

1. A laser processing method comprising:
a first step of preparing a wafer including a semiconductor substrate having a front surface and a back surface and a functional element layer formed on the front surface, and forming a plurality of rows of modified regions in the semiconductor substrate along each of a plurality of lines by irradiating the wafer with laser light from the back surface side along each of the plurality of lines;
a second step of inspecting a tip position of a fracture in an inspection region with inspection light, the tip position of the fracture being in the thickness direction of the semiconductor substrate, the tip position being within the semiconductor substrate between the back surface and the modified region closest to the back surface among the plurality of rows of modified regions, the fracture extending to the back surface side from the modified region closest to the back surface, in the second step, by passing the inspection light through an objective lens having a numerical aperture of 0.45 or more, to inspect the tip position of the fracture having a width smaller than a wavelength of the inspection light; and
a step of notifying an operator of a result of the inspecting the tip position, wherein
in the first step, the wafer is irradiated with the laser light from the back surface side along each of the plurality of lines under a condition that a fracture extending through the plurality of rows of modified regions is formed, and
in the second step, the tip position is inspected by aligning a focus of the objective lens from the back surface side in the inspection region and detecting, through the objective lens, the inspection light propagating in the semiconductor substrate from the front surface side to the back surface side.

2. The laser processing method according to claim 1, wherein
in the first step, the wafer is irradiated with the laser light from the back surface side along each of the plurality of lines under a condition that the fracture extending through the plurality of rows of modified regions reaches the front surface.

3. The laser processing method according to claim 2, further comprising:
a third step of evaluating a processing result in the first step based on an inspection result in the second step, wherein
in the third step,
it is evaluated that the fracture extending through the plurality of rows of modified regions reaches the front surface, in a case where the tip position is located on the back surface side with respect to a reference position between the back surface and the modified region closest to the back surface, and it is evaluated that the fracture extending through the plurality of rows of modified regions does not reach the front surface, in a case where the tip position is located on the front surface side with respect to the reference position.

4. The laser processing method according to claim 3, wherein the inspection region is a region extending from the reference position to the back surface side and not reaching the back surface, and in the third step, it is evaluated that the fracture extending through the plurality of rows of modified regions reaches the front surface, in a case where the tip position is located in the inspection region, and it is evaluated that fracture extending through the plurality of rows of modified regions does not reach the front surface, in a case where the tip position is not located in the inspection region.

5. The laser processing method according to claim 1, wherein the plurality of rows of modified regions are two rows of modified regions.

6. A method for manufacturing a semiconductor device, the method comprising:

a first step of preparing a wafer including a semiconductor substrate having a front surface and a back surface and a functional element layer formed on the front surface, and forming a plurality of rows of modified regions in the semiconductor substrate along each of a plurality of lines by irradiating the wafer with laser light from the back surface side along each of the plurality of lines;

a second step of inspecting a tip position of a fracture in an inspection region with inspection light, the tip position of the fracture being in the thickness direction of the semiconductor substrate, the tip position being within the semiconductor substrate between the back surface and the modified region closest to the back surface among the plurality of rows of modified regions, the fracture extending to the back surface side from the modified region closest to the back surface, in the second step, by passing the inspection light through an objective lens having a numerical aperture of 0.45 or more, to inspect the tip position of the fracture having a width smaller than a wavelength of the inspection light; and a step of notifying an operator of a result of the inspecting the tip position, wherein in the first step, the wafer is irradiated with the laser light from the back surface side along each of the plurality of lines under a condition that a fracture extending through the plurality of rows of modified regions is formed, wherein in the second step, the tip position is inspected by aligning a focus of the objective lens from the back surface side in the inspection region and detecting, through the objective lens, the inspection light propagating in the semiconductor substrate from the front surface side to the back surface side, and wherein in the first step, the wafer is irradiated with the laser light from the back surface side along each of the plurality of lines under a condition that the fracture extending through the plurality of rows of modified regions reaches the front surface;

a third step of evaluating a processing result in the first step based on an inspection result in the second step, wherein in the third step, it is evaluated that the fracture extending through the plurality of rows of modified regions reaches the front surface, in a case where the tip position is located on the back surface side with respect to a reference position between the back surface and the modified region closest to the back surface, and it is evaluated that the fracture extending through the plurality of rows of modified regions does not reach the front surface, in a case where the tip position is located on the front surface side with respect to the reference position; and a fourth step of, in a case where it is evaluated that the fracture extending through the plurality of rows of modified regions reaches the front surface in the third step, exposing the fracture extending through the plurality of rows of modified regions to the back surface by grinding the back surface, and cutting the wafer into a plurality of semiconductor devices along each of the plurality of lines.

7. The method for manufacturing a semiconductor device according to claim 6, wherein in the fourth step, the back surface is ground up to at least the reference position.

8. An inspecting device comprising:

a stage configured to support a wafer including a semiconductor substrate having a front surface and a back surface and a functional element layer formed on the front surface, the wafer in which a plurality of rows of modified regions are formed in the semiconductor substrate along each of a plurality of lines;

a light source configured to output inspection light having transparency to the semiconductor substrate;

an objective lens configured to pass the inspection light output from the light source and propagated through the semiconductor substrate;

a light detection part configured to detect the inspection light passing through the objective lens; and an inspection part configured to inspect a tip position of a fracture having a width smaller than a wavelength of the inspection light in an inspection region, the tip position of the fracture being in the thickness direction of the semiconductor substrate, the tip position being within the semiconductor substrate between the back surface and the modified region closest to the back surface among the plurality of rows of modified regions, based on a signal output from the light detection part, the fracture extending to the back surface side from the modified region closest to the back surface side; and a notification unit configured to notify an operator of a result of the inspecting the tip position, wherein the objective lens has a numerical aperture of 0.45 or more, and aligns a focus of the objective lens light from the back surface side in the inspection region, and the detection part detects, through the objective lens, the inspection light propagating in the semiconductor substrate from the front surface side to the back surface side.

9. The inspecting device according to claim 8, wherein the objective lens includes a correction ring.

* * * * *